United States Patent
Zhou et al.

(10) Patent No.: US 12,507,545 B2
(45) Date of Patent: Dec. 23, 2025

(54) DISPLAY SUBSTRATE AND DISPLAY DEVICE

(71) Applicants: Chengdu BOE Optoelectronics Technology Co., Ltd., Chengdu (CN); Beijing BOE Technology Development Co., Ltd., Beijing (CN)

(72) Inventors: Hongjun Zhou, Beijing (CN); Lili Du, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 628 days.

(21) Appl. No.: 17/791,956

(22) PCT Filed: Aug. 31, 2021

(86) PCT No.: PCT/CN2021/115556
§ 371 (c)(1),
(2) Date: Jul. 11, 2022

(87) PCT Pub. No.: WO2023/028814
PCT Pub. Date: Mar. 9, 2023

(65) Prior Publication Data
US 2023/0127776 A1    Apr. 27, 2023

(51) Int. Cl.
*H10K 59/131* (2023.01)
*H01L 21/66* (2006.01)
(Continued)

(52) U.S. Cl.
CPC .......... *H10K 59/131* (2023.02); *H01L 22/32* (2013.01); *H10K 59/124* (2023.02); *H10K 71/851* (2023.02)

(58) Field of Classification Search
CPC ............................. H10K 59/131; H01L 22/32
See application file for complete search history.

(56) References Cited

U.S. PATENT DOCUMENTS 6,876,145 B1 * 4/2005 Yamazaki ............ H10K 59/871
                                                        313/504
7,839,479 B2    11/2010 Choi
(Continued)

FOREIGN PATENT DOCUMENTS

| CN | 2720623 Y | 8/2005 |
| CN | 101414066 A | 4/2009 |

(Continued)

OTHER PUBLICATIONS

Extended European Search Report, for European Patent Application No. 21955387.2, dated Mar. 15, 2024, 9 pages.

*Primary Examiner* — Britt D Hanley
*Assistant Examiner* — Jason James Greaving
(74) *Attorney, Agent, or Firm* — Westman, Champlin & Koehler, P.A.

(57) ABSTRACT

A display substrate (100) and a display device are provided. The display substrate (100) includes: a base substrate (110) including a display area (AA) and a peripheral area (PA); a plurality of sub-pixels (Px1); a plurality of pins (160), wherein orthographic projections of the plurality of pins (160) on the base substrate (110) extend in a first direction (AA') and distributed at intervals in a second direction (BB') intersecting with the first direction (AA'); a plurality of leads (71, 74, 75, 78, 79) located in at least the peripheral area (PA), wherein the plurality of pins (160) are electrically connected to the plurality of sub-pixels (Px1) through the plurality of leads (71, 74, 75, 78, 79); a plurality of extension pads (130) located on a side of the plurality of pins (160) away from the display area (AA), wherein the plurality of extension pads (130) extend in the first direction and are (Continued)

distributed at intervals in the second direction, and the plurality of extension pads (130) are electrically connected to the plurality of pins (160); and a plurality of spacers located between the plurality of extension pads (130) and extending in the first direction, wherein orthographic projections of the plurality of spacers on the base substrate (110) do not overlap orthographic projections of the plurality of extension pads (130) on the base substrate, and the plurality of spacers are configured to electrically insulate the plurality of extension pads (130) from each other.

18 Claims, 12 Drawing Sheets

(51) Int. Cl.
   *H10K 59/124* (2023.01)
   *H10K 71/00* (2023.01)

(56) References Cited

U.S. PATENT DOCUMENTS

| | | |
|---|---|---|
| 9,105,633 B2 | 8/2015 | Yang |
| 10,629,635 B2 | 4/2020 | Xian et al. |
| 11,121,046 B2 | 9/2021 | Lee et al. |
| 11,327,372 B2 | 5/2022 | Yu et al. |
| 2006/0001792 A1 | 1/2006 | Choi |
| 2018/0294288 A1 | 10/2018 | Xian et al. |
| 2019/0088909 A1 | 3/2019 | Cheon et al. |
| 2019/0197936 A1 | 6/2019 | Kuo et al. |
| 2019/0334115 A1* | 10/2019 | Matsuda ............ H10K 50/8426 |
| 2019/0357367 A1* | 11/2019 | Chung ................. H05K 5/0017 |
| 2020/0043815 A1 | 2/2020 | Lee et al. |
| 2021/0026182 A1* | 1/2021 | Yu ....................... G02F 1/13458 |
| 2021/0026423 A1* | 1/2021 | Choi .................... H10K 77/111 |
| 2021/0202650 A1* | 7/2021 | Hong ................... H10K 59/131 |
| 2021/0202658 A1* | 7/2021 | Shim .................... H10K 59/131 |
| 2021/0335986 A1* | 10/2021 | Jeon ..................... H10D 86/443 |
| 2022/0045160 A1* | 2/2022 | Lee ....................... H10K 59/121 |
| 2022/0199740 A1* | 6/2022 | Zhang .................. H10K 59/131 |

FOREIGN PATENT DOCUMENTS

| | | | | |
|---|---|---|---|---|
| CN | 101937887 A | 1/2011 | | |
| CN | 107369692 A | 11/2017 | | |
| CN | 110783214 A | 2/2020 | | |
| CN | 111736380 A | 10/2020 | | |
| CN | 112582433 A | 3/2021 | | |
| CN | 113066796 A | * 7/2021 | .......... | G06F 3/0445 |
| JP | 2006013444 A | 1/2006 | | |
| KR | 100783813 B1 | 12/2007 | | |

* cited by examiner

DISPLAY SUBSTRATE AND DISPLAY DEVICE

CROSS-REFERENCE TO RELATED APPLICATIONS

This application is a Section 371 National Stage Application of International Application No. PCT/CN2021/115556, filed on Aug. 31, 2021, entitled "DISPLAY SUBSTRATE AND DISPLAY DEVICE", the disclosure of which is incorporated herein by reference in its entirety.

TECHNICAL FIELD

The present disclosure relates to a field of display technology, and in particular to a display substrate and a display device.

BACKGROUND

In design of a display panel, in order to improve a test efficiency, a test is performed by lighting on display panels in groups before cutting a substrate to obtain respective display panels. Therefore, it is desired to lead out signal lines used for testing each display panel from the display panel to corresponding pins on the substrate. However, in this way, the signal lines need to cross a cutting channel of the display panel, and thus may be easily affected by a structure of the cutting channel.

SUMMARY

Embodiments of the present disclosure provide a display substrate, including:
- a base substrate including a display area and a peripheral area located on at least one side of the display area;
- a plurality of sub-pixels located in the display area;
- a plurality of pins located in the peripheral area of the base substrate and configured to transmit an electrical signal to the plurality of sub-pixels, wherein orthographic projections of the plurality of pins on the base substrate extend in a first direction and are distributed at intervals in a second direction intersecting with the first direction;
- a plurality of leads located in at least the peripheral area of the base substrate, wherein the plurality of pins are electrically connected to the plurality of sub-pixels through the plurality of leads;
- a plurality of extension pads located on a side of the plurality of pins away from the display area, wherein the plurality of extension pads extend in the first direction and are distributed at intervals in the second direction, and the plurality of extension pads are electrically connected to the plurality of pins; and
- a plurality of spacers located between the plurality of extension pads and extending in the first direction, wherein orthographic projections of the plurality of spacers on the base substrate do not overlap orthographic projections of the plurality of extension pads on the base substrate, and the plurality of spacers are configured to electrically insulate the plurality of extension pads from each other.

In an example, the plurality of spacers and the plurality of extension pads are alternately distributed.

In an example, the plurality of spacers and the plurality of extension pads are alternately distributed one by one.

In an example, the display substrate includes a first dielectric layer located on the base substrate, the first dielectric layer has a plurality of first openings arranged in the second direction and extending in the first direction, at least a portion of the extension pad is located in the first opening, and portions of the first dielectric layer between adjacent first openings are implemented as the plurality of spacers.

In an example, the display substrate includes a first dielectric layer located on the base substrate, the first dielectric layer has a plurality of first openings arranged in the second direction and extending in the first direction, the plurality of first openings are implemented as the plurality of spacers, the extension pads are located on a side of the first dielectric layer between the adjacent first openings away from the base substrate, and orthographic projections of the plurality of first openings on the base substrate do not overlap the orthographic projections of the plurality of extension pads on the base substrate.

In an example, the display substrate further including a second dielectric layer and a third dielectric layer located in the peripheral area, wherein the second dielectric layer is located on a side of the first dielectric layer away from the base substrate, the third dielectric layer is located on a side of the second dielectric layer away from the base substrate, the extension pad is located in a conductor layer between the first dielectric layer and the second dielectric layer, the second dielectric layer has a second opening, the third dielectric layer has a third opening, and at least a portion of the extension pad is exposed from the second opening and the third opening.

In an example, the orthographic projections of the plurality of first openings on the base substrate are located within an orthographic projection of the second opening on the base substrate, and the orthographic projection of the second opening on the base substrate is located within an orthographic projection of the third opening on the base substrate.

In an example, each of the plurality of extension pads has a first orthographic projection on the base substrate, each of the plurality of spacers has a second orthographic projection on the base substrate, and a distance between each first orthographic projection and a second orthographic projection adjacent to the first orthographic projection in the second direction is in a range of 0 μm to 20 μm.

In an example, a center line of each first orthographic projection in the first direction is distanced from center lines of two second orthographic projections adjacent to the first orthographic projection in the first direction by the same distance.

In an example, the first direction is perpendicular to the second direction.

In an example, the orthographic projection of the spacer on the base substrate has a rectangle shape.

In an example, the first direction is not perpendicular to the second direction, and the orthographic projection of the spacer on the base substrate has a parallelogram shape.

In an example, a thickness of the first dielectric layer is in a range of 500 nm to 1000 nm, and a thickness of the extension pad in a direction perpendicular to a surface of the base substrate is in a range of 200 nm to 900 nm.

In an example, a dimension of the spacer in the first direction is less than a dimension of the extension pad in the first direction.

In an example, the display substrate further including: a test-related circuit located in the peripheral area and arranged on a side of the plurality of pins facing the display area, wherein the test-related circuit surrounds at least a portion of the display area, and the test-related circuit is connected to the plurality of sub-pixels in the display area through a plurality of signal lines and is connected to the plurality of pins through the plurality of leads.

In an example, the plurality of extension pads include at least one first extension pad and at least one second extension pad, each first extension pad is connected to one of the plurality of pins, each second extension pad is connected to at least two of the plurality of pins, and a line width of the first extension pad is less than a line width of the second extension pad.

In an example, the test-related circuit includes a cell test circuit, the plurality of signal lines includes a plurality of data lines, the plurality of leads include a plurality of cell test control signal lines, and the plurality of pins includes a plurality of first pins, and
wherein the cell test circuit is connected to the plurality of sub-pixels in the display area through the plurality of data lines, and is connected to the plurality of first pins through the cell test control signal lines.

In an example, the test-related circuit further includes a drive circuit, the plurality of signal lines further includes a plurality of drive signal lines, the plurality of leads further includes a plurality of drive control signal lines and a plurality of drive test signal lines, and the plurality of pins further include a plurality of second pins, and
wherein the drive circuit is connected to the plurality of sub-pixels in the display area through the plurality of drive signal lines, and is connected to the plurality of second pins through the plurality of drive control signal lines and the plurality of drive test signal lines.

In an example, the test-related circuit further includes a multiplexing circuit, the plurality of leads further includes a plurality of multiplexing control signal lines, and the plurality of pins further includes a plurality of third pins, and
wherein the multiplexing circuit is connected to the plurality of sub-pixels in the display area through the plurality of data lines, and is connected to the plurality of third pins through the plurality of multiplexing control signal lines.

In an example, the test-related circuit further includes a supply voltage line and a reference voltage line, the plurality of signal lines further includes a first supply voltage wire and a first reference voltage wire, the plurality of leads further includes a second supply voltage wire and a second reference voltage wire, and the plurality of pins further includes a plurality of fourth pins, and
wherein the supply voltage line is connected to the plurality of sub-pixels in the display area through the first supply voltage wire, and the reference voltage line is connected to the plurality of sub-pixels in the display area through the first reference voltage wire, the supply voltage line is connected to at least one of the plurality of fourth pins through the second supply voltage wire, and the reference voltage line is connected to at least another of the plurality of fourth pins through the second reference voltage wire.

In an example, the display substrate further including: a fourth dielectric layer located in the peripheral area and arranged between the first dielectric layer and the base substrate, wherein the fourth dielectric layer has a fourth opening, an orthographic projection of the fourth opening on the base substrate is located within the orthographic projection of the second opening on the base substrate, and the orthographic projections of the plurality of first openings on the base substrate are located within the orthographic projection of the fourth opening on the base substrate.

In an example, the display substrate further including: a fifth dielectric layer located in the peripheral area and arranged between the second dielectric layer and the third dielectric layer, wherein the fifth dielectric layer has a fifth opening, an orthographic projection of the fifth opening on the base substrate is located within the orthographic projection of the third opening on the base substrate, and the orthographic projection of the second opening on the base substrate is located within the orthographic projection of the fifth opening on the base substrate.

In an example, at least one of the plurality of sub-pixels includes a drive thin film transistor and a storage capacitor;
the drive thin film transistor includes an active layer located on the base substrate, a gate electrode located on a side of the active layer away from the base substrate, a first gate insulating layer located between the active layer and the gate electrode, a second gate insulating layer located on a side of the gate electrode away from the base substrate, an interlayer dielectric layer located on a side of the second gate insulating layer away from the base substrate, and a source electrode and a drain electrode located on a side of the interlayer dielectric layer away from the base substrate;
the storage capacitor includes a first capacitor electrode and a second capacitor electrode, the first capacitor electrode is located in the same layer as the gate electrode, and the second capacitor electrode is located between the second gate insulating layer and the interlayer dielectric layer; and
the plurality of extension pads are disposed in the same layer as at least one of the source electrode and the drain electrode of the plurality of sub-pixels, and the first dielectric layer located in the peripheral area is disposed in the same layer as the interlayer dielectric layer.

In an example, at least one of the plurality of sub-pixels further includes:
a planarization layer located on the side of the interlayer dielectric layer away from the base substrate;
an anode located on a side of the planarization layer away from the base substrate and connected to the source electrode or the drain electrode by passing through the planarization layer;
a pixel defining layer located on the side of the planarization layer away from the base substrate and partially covering the anode,
wherein the second dielectric layer located in the peripheral area is disposed in the same layer as the planarization layer, and the third dielectric layer located in the peripheral area is disposed in the same layer as the pixel defining layer.

In an example, at least one of the plurality of sub-pixels further includes:
a first planarization layer located on the side of the interlayer dielectric layer away from the base substrate;
a transfer electrode located on a side of the first planarization layer away from the base substrate, and connected to the source electrode of the thin film transistor through a via hole disposed in the first planarization layer;
a second planarization layer located on a side of the transfer electrode away from the base substrate;
an anode located on a side of the second planarization layer away from the base substrate, and connected to the transfer electrode through a via hole in the second planarization layer; and a pixel defining layer located on the side of the second planarization layer away from the base substrate and at least partially covering the anode, wherein the peripheral area of the base substrate further includes a fifth dielectric layer located between the second dielectric layer and the third dielectric layer, the second dielectric layer is disposed in the same layer as the first planarization layer, the third dielectric layer is disposed in the same layer as the pixel defining layer, and the fifth dielectric layer is disposed in the same layer as the second planarization layer.

In an example, at least one of the plurality of sub-pixels further includes a buffer layer located between the base substrate and the first gate insulating layers; and the peripheral area of the base substrate further includes a fourth dielectric layer located between the first dielectric layer and the base substrate, and the fourth dielectric layer is disposed in the same layer as at least one of the buffer layer, the first gate insulating layer and the second gate insulating layers are disposed on the same layer.

A display device is further provided, including the above-mentioned display substrate.

DETAILED DESCRIPTION OF EMBODIMENTS

Figure 1:
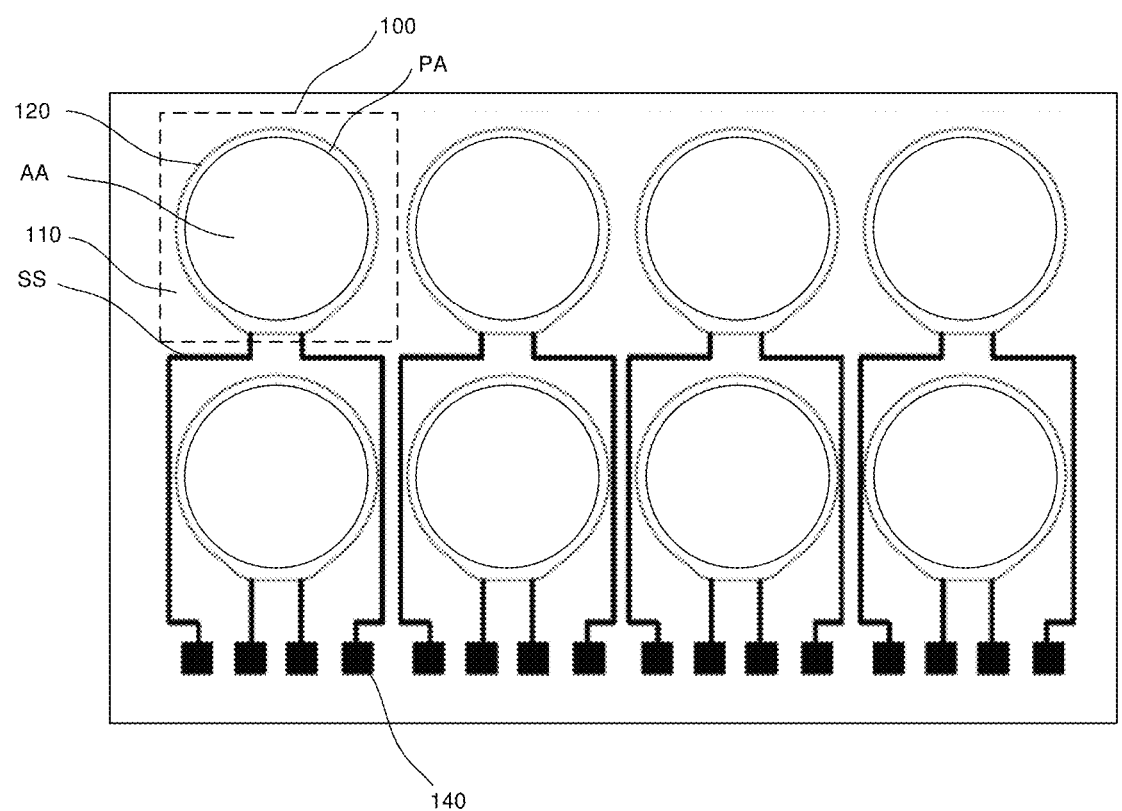
FIG. 1 shows a schematic plan view of a substrate to be cut according to an embodiment of the present disclosure.

In order to make the purposes, technical solutions and advantages of the embodiments of the present disclosure clearer, the technical solutions in the embodiments of the present disclosure will be clearly and completely described with reference to the accompanying drawings in the embodiments of the present disclosure. Obviously, the described embodiments are some, but not all, of the embodiments of the present disclosure. Based on the described embodiments of the present disclosure, all other embodiments obtained by those skilled in the art without creative efforts fall within the scope of protection of the present disclosure. It should be noted that throughout the drawings, the same elements are indicated by the same or similar reference numerals. In the following description, some specific embodiments are for the purpose of description only, and should not be construed as any limitation to the present disclosure, but are merely examples of embodiments of the present disclosure. When it may cause confusion in the understanding of the present disclosure, conventional structures or configurations may be omitted. It should be noted that the shapes and dimensions of components in the drawings do not necessarily reflect actual dimensions and ratios, but merely illustrate the content of the embodiments of the present disclosure.

Unless otherwise defined, technical or scientific terms used in the embodiments of the present disclosure shall have the ordinary meanings as understood by those skilled in the art. "First", "second" and similar words used in the embodiments of the present disclosure do not represent any order, quantity or importance, but are only used to distinguish different components.

In addition, in the description of the embodiments of the present disclosure, the term "connected" or "connected to" may mean that two components are directly connected, or may mean that two components are connected via one or more other components. Furthermore, the two components may be connected or coupled by wired or wirelessly.

For a design in which the signal line(s) need to cross a cutting chancel, generally two design methods may be used, one of which is to use a gate layer (which may be a first gate layer or a second gate layer) for wiring, and the other is to use a source and drain layer for wiring. Usually, an organic layer and an inorganic layer need to be removed at a position of the cutting channel so as to facilitate cutting. When a gate layer is used for wiring the signal line(s), an interlayer dielectric layer needs to be used to protect the signal line(s) in the gate layer in order to avoid the metal of the gate layer being etched away by the wet etching process of anode. However, this requires a large amount of interlayer dielectric film layer to be reserved at the wiring position of the signal line, leading to a risk of cracking the inorganic layer. For the other design of using the source and drain layer for wiring, since the organic layer, inorganic layer and other film layers are removed in the cutting channel, the channel is deep and thus metal residues may easily be generated at the position of the cutting channel during an etching process of the source and drain layer or an etching process of the anode, leading to a risk of short circuit of the signal line.

FIG. 1 shows a schematic plan view of a substrate to be cut according to an embodiment of the present disclosure.

As shown in FIG. 1, the substrate to be cut includes a plurality of display substrates 100. In FIG. 1, the plurality of display substrates 100 are arranged in an array, for example, a 2×4 array. However, the embodiments of the present disclosure are not limited thereto. The plurality of display substrates 100 may be arranged in other forms as required, and the number of the display substrates 100 may be set as required. Each display substrate 100 includes a base substrate 110. The plurality of display substrates 100 on the substrate to be cut may share a base substrate 110. The base substrate 110 may be a rigid base substrate, such as a glass substrate. In some embodiments, the base substrate 110 may be a flexible base substrate, such as a flexible base substrate made of polyimide materials. The base substrate 110 is provided with a plurality of display areas AA and a peripheral area PA located on at least one side of the display areas. A plurality of sub-pixels are provided in the display areas AA. The substrate to be cut is further provided with a plurality of cutting channels 120 surrounding the plurality of display areas AA, for example, each display area AA is surrounded by a corresponding cutting channel 120. It should be noted that the cutting channel is a definition of an area where the cutting is performed, not a physical structure.

A plurality of sets of connection wires SS and a plurality of sets of contact pads 140 are also arranged on the substrate to be cut. The plurality of sets of contact pads 140 are located outside each display substrate 100. A plurality of sub-pixels in the display area AA of each display substrate 100 are connected to a set of contact pads of the plurality of sets of contact pads 140 through a set of connection wires of the plurality of sets of connection wires SS. In FIG. 1, only two connection wires SS and two contact pads 140 are shown for each display substrate 100 for the sake of simplicity. However, this is only for illustration, and in practice, any number of connection wires SS and contact pads 140 may be set as required.

The connection wires SS and the contact pads 140 may be used to perform a cell test on the sub-pixels in the display area AA. For example, a cell test of the sub-pixels in the display area AA of each display substrate 100 may be implemented by applying various test signals for the cell test to the contact pads 140. After the cell test is completed, the substrate to be cut may be cut, for example, along each cutting channel 120 so as to obtain a plurality of independent display substrates 100. The cutting of the substrate may be for example but not limited to cutting by cutter wheel or laser cutting. In other words, a cutting area defined along each cutting channel corresponds to an independent display substrate 100. The structure of the display substrate will be described in detail below with reference to FIG. 2 to FIG. 5.

Figure 2:
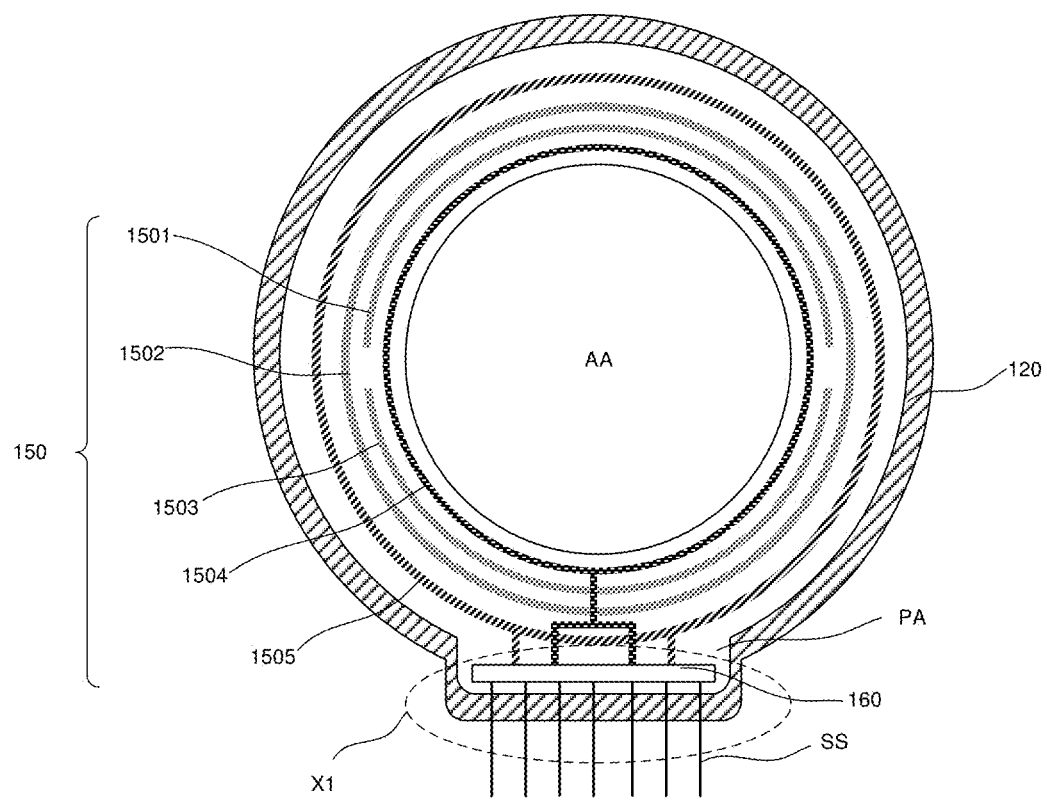
FIG. 2 shows a schematic diagram of a display substrate according to an embodiment of the present disclosure.

FIG. 2 shows a schematic diagram of a display substrate according to an embodiment of the present disclosure.

As shown in FIG. 2, the display substrate includes a display area AA and a peripheral area PA located on at least one side of the display area. FIG. 2 shows the structure of the display substrate on the substrate to be cut before the substrate to be cut is cut, so a boundary of the display substrate is defined by the cutting channel 120 surrounding the display area. In FIG. 2, a projection of the display area AA on the base substrate has a circular outline, a projection of the cutting channel 120 on the base substrate is a strip extending around the display area AA, and a pattern surrounded by the strip is substantially circular. However, the embodiments of the present disclosure are not limited thereto. Projection shapes of the cutting channel and the display area may be set as required. For example, the projection of the display area on the substrate may have a shape of a rectangle, a rounded rectangle, an ellipse, a polygon, or the like, and the cutting channel surrounding the display area may be designed to have a corresponding projection pattern as required, such as a rectangle, a rounded rectangle, a circle, an ellipse, a polygon, or even an irregular shape.

As shown in FIG. 2, in the display substrate, a plurality of pins 160 for transmitting an electrical signal to the plurality of sub-pixels are further provided in the peripheral area PA located on at least one side of the display area AA. In FIG. 2, the plurality of pins 160 are located on a side (a side close to a straight edge of the cutting channel in FIG. 2) of the display area AA. In some embodiments, orthographic projections of the plurality of pins 160 on the base substrate may extend in a first direction and be distributed at intervals in a second direction, for example, may be arranged in one or more rows along a side edge of the display area, which will be described in further detail below. However, the embodiments of the present disclosure are not limited thereto. Positions of a test-related circuit 150 and the pins 160 may be set as required.

As shown in FIG. 2, the test related circuit 150 may also be provided in the peripheral area PA. The test-related circuits 150 may include a cell test circuit 1501. In some embodiments, the test-related circuit may further include at least one of a drive circuit 1502, a multiplexing circuit 1503, a supply voltage line 1504 and a reference signal line 1505. The test-related circuit 150 is arranged on a side of the plurality of pins 160 facing the display area AA, and surrounds at least a portion of the display area AA. The test-related circuit 150 may be connected to the plurality of sub-pixels in the display area AA through a plurality of signal lines, and connected to the plurality of pins 160 through a plurality of leads.

As shown in FIG. 2, the cell test circuit 1501 may be disposed on a side of the display area AA. For example, in FIG. 2, the cell test circuit 1501 may be disposed around a side edge of the display area AA away from the plurality of pins 160. The cell test circuit 1501 may be connected to the plurality of sub-pixels in the display area AA, and is used to perform a cell test on the plurality of sub-pixels in the display area. A plurality of cell test control signal lines connected to the cell test circuit 1501 may be led out to the plurality of pins 160.

The drive circuit 1502 may be disposed around the display area AA, so that the cell test circuit 1501 is located between the drive circuit 1502 and the display area AA. The drive circuit 1502 may include a gate drive circuit and a light-emitting drive circuit. The gate drive circuit is used to turn on the sub-pixels in the display area AA, and the light-emitting drive circuit is used to control the turned-on sub-pixels to emit light. A plurality of drive control signal lines and a plurality of drive test signal lines connected to the drive circuit 1502 may be led out to the pins 160.

The multiplexing circuit 1503 may be located on a side of the display area AA away from the cell test circuit 1501, for example, disposed around a side edge of the display area AA away from the cell test circuit 1501. The multiplexing circuit 1503 is used to multiplex a received input signal into a multiplexed signal and provide the multiplexed signal to the plurality of sub-pixels in the display area AA. A plurality of multiplexing control signal lines connected to the multiplexing circuit 1503 may be led out to the pins 160.

The supply voltage line 1504 and the reference voltage line 1505 are used to supply power to various elements in the display substrate, for example, to supply power to the sub-pixels in the display area AA. The supply voltage line 1504 and the reference voltage line 1505 may also be used to supply power to at least one of the above-mentioned cell test circuit 1501, drive circuit 1502 and multiplexing circuit 1503. As shown in FIG. 2, the supply voltage line 1504 having an annular shape surrounds the display area AA and is located in an area between the display area AA and a combination of the cell test circuit 1501 and the multiplexing circuit 1503. The reference voltage line 1505 having an annular shape surrounds the above-mentioned drive circuit 1502. In FIG. 2, the supply voltage line 1504 is connected to at least two of the plurality of pins 160 through a Y-shaped voltage wire, and the reference voltage line 1505 is connected to at least another two of the plurality of pins 160 through two voltage wires extending in a bar shape.

Continuing to refer to FIG. 2, the plurality of pins 160 are respectively connected to the plurality of connection wires SS. As seen from FIG. 2, in an area shown by a dotted line, the cutting channel 120 extends to intersect with the plurality of connection wires SS, and the intersection area will be described in detail below.

Figure 3:
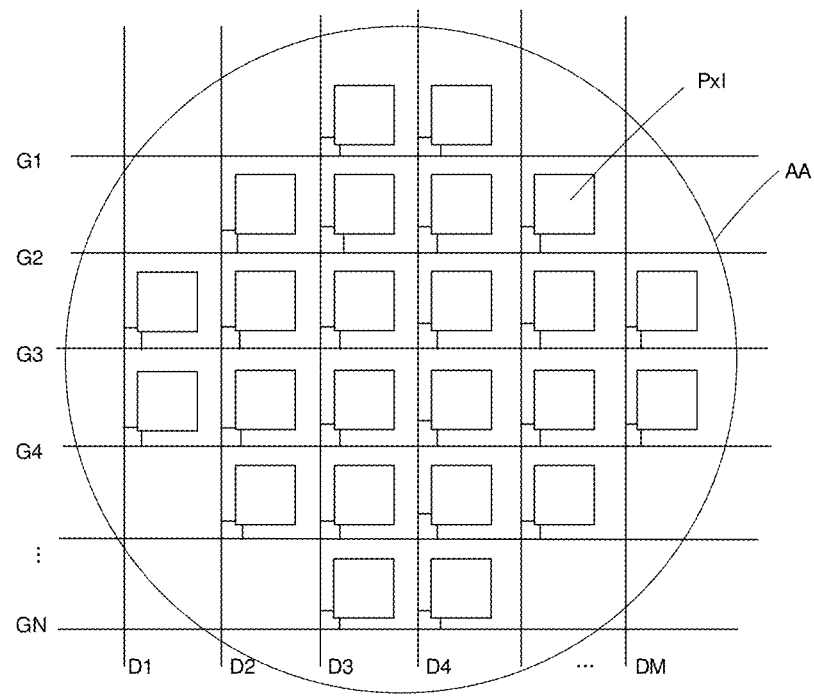
FIG. 3 shows a schematic diagram of a display area in FIG. 2.

FIG. 3 shows a schematic diagram of the display area in FIG. 2.

As shown in FIG. 3, a plurality of sub-pixels Px1 are provided in the display area AA, and the plurality of sub-pixels Px1 are arranged in an array. In FIG. 3, the plurality of sub-pixels Px1 are arranged in N rows and M columns. As shown in FIG. 2, the array is arranged in a circle as a whole, so that the projection of the display area AA on the base substrate 110 has a circular outline. However, the embodiments of the present disclosure are not limited thereto. The plurality of sub-pixels Px1 may be arranged in an array of other shapes as required, such as a rectangle, a rounded rectangle, a polygon, etc.

The display area AA is also provided with a plurality of gate lines G1, G2, . . . . GN electrically connected to the plurality of sub-pixels Px1. The display area AA is also provided with a plurality of data lines D1, D2 . . . . DM electrically connected to the plurality of sub-pixels Px1. In FIG. 3, N rows of sub-pixels Px1 are connected to N gate lines G1, G2, . . . . GN in one-to-one correspondence, and M columns of sub-pixels Px1 are connected to M data lines D1, D2 . . . . DM in one-to-one correspondence. That is, each row of sub-pixels is connected to a gate line, and each column of sub-pixels is connected to a data line. However, the embodiments of the present disclosure are not limited thereto. The number of the gate lines, the number of the data lines, the connection of the gate lines and the connection of the data lines may be selected as required. For example, each row of sub-pixels may be connected to two gate lines, and the number of gate lines is twice the number of sub-pixel rows. Alternatively, each data line is connected to two columns of sub-pixels, and the number of data lines is half of the number of sub-pixel columns, etc.

During operation, the gate drive circuit applies a gate drive signal to the gate lines G1 to GN so as to turn on the sub-pixels Px1 in each row, and the source drive circuit applies a source drive signal to the data lines D1 to DM, so that the turned-on sub-pixels Px1 display according to the applied source drive signal. In some embodiments, a plurality of light-emitting control lines connected to the plurality of sub-pixels may also be provided in the display area, and the light-emitting drive circuit provides a light-emitting control signal to the plurality of sub-pixels through the plurality of light-emitting control lines.

Figure 4:
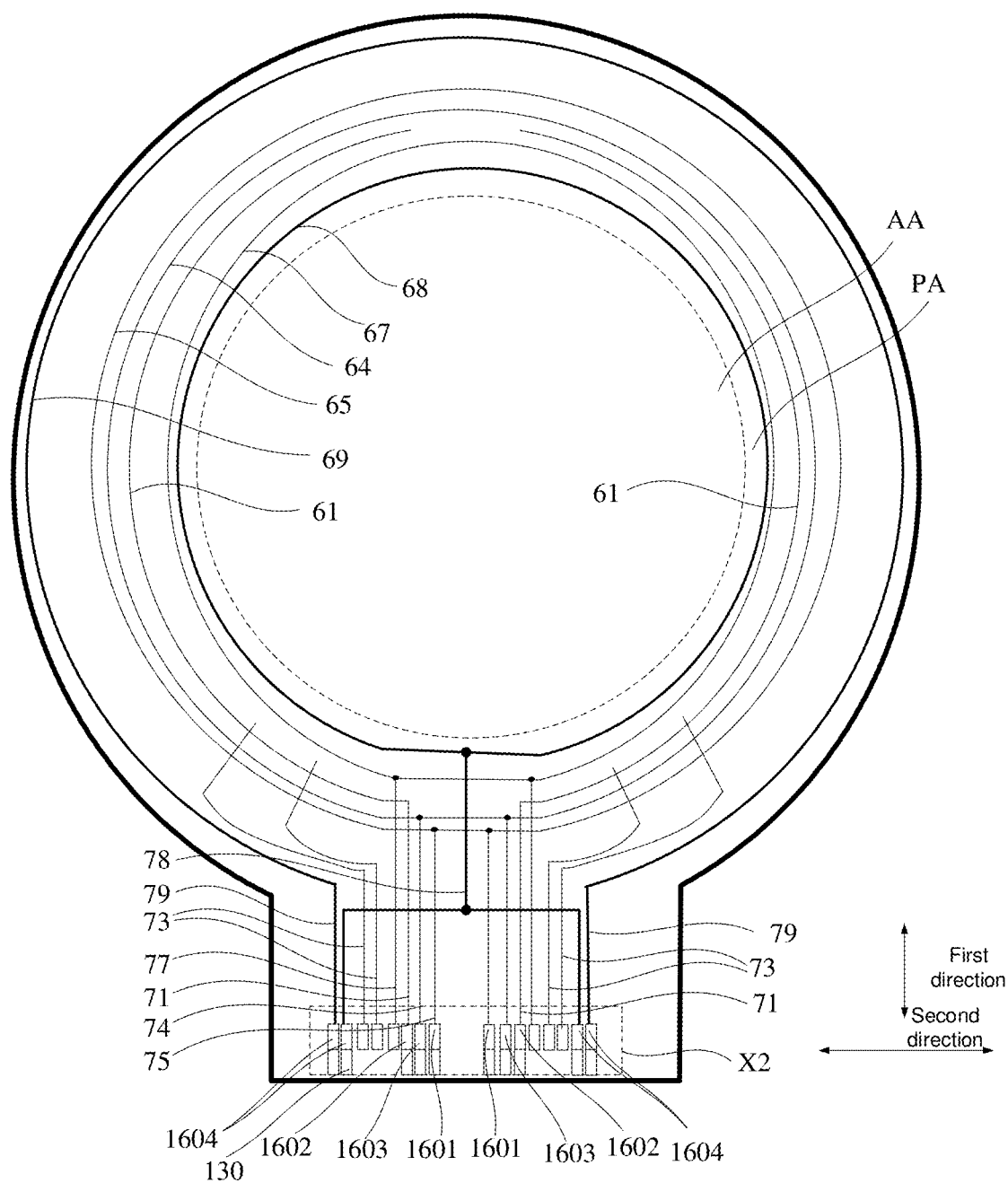
FIG. 4 shows a schematic diagram of a display substrate according to another embodiment of the present disclosure.

FIG. 4 shows a schematic diagram of a display substrate according to another embodiment of the present disclosure. The display substrate shown in FIG. 4 is a display substrate obtained by cutting the substrate to be cut.

As shown in FIG. 4, the display substrate includes a base substrate 110, a plurality of pins, a plurality of leads 71, 74, 75, 78 and 79 and a plurality of extension pads 130. The plurality of extension pads 130 are obtained by cutting the above-mentioned plurality of connection wires. The plurality of pins includes at least one of a plurality of first pins 1601, a plurality of second pins 1602, a plurality of third pins 1603 and a plurality of fourth pins 1604. The plurality of pins 1601 to 1604 are electrically connected to the plurality of sub-pixels through the plurality of leads 71, 74, 75, 78 and 79. The plurality of extension pads 130 are located on a side of the plurality of pins 1601 to 1604 away from the display area AA, extend in the first direction and are distributed at intervals in the second direction. The plurality of extension pads 130 are electrically connected to the plurality of pins 1601 to 1604.

The test-related circuit on the display substrate may include at least one of a cell test circuit 65, a drive circuit 61, a multiplexing circuit 64, a supply voltage line 68 and a reference voltage line 69. The test-related circuit is connected to the plurality of sub-pixels in the display area AA through a plurality of signal lines, and is connected to the plurality of pins 1601 to 1604 through the plurality of leads 71, 74, 75, 78 and 79.

As shown in FIG. 4, the plurality of pins may include at least one of the plurality of first pins 1601, the plurality of second pins 1602, the plurality of third pins 1603 and the plurality of fourth pins 1604.

The cell test circuit 65 may be connected to the plurality of sub-pixels in the display area AA through a plurality of data lines, and may be connected to the plurality of first pins 1601 through the plurality of leads 75. The plurality of leads 75 may include a cell test control signal line used by the cell test circuit to receive a cell test control signal, including but not limited to at least one of a switch wire SW, a first test data wire DR, a second test data wire DG and a third test data wire DB. In some embodiments, the switch wire SW may include a first switch wire SWR, a second switch wire SWG, and a third switch wire SWB.

The drive circuit 61 may be connected to the plurality of sub-pixels in the display area AA through a plurality of drive signal lines, and may be connected to the plurality of second pins 1602 through the plurality of leads 71. The plurality of drive signal lines may be wires used by the drive circuit to provide a drive signal, including but not limited to a gate line and a light-emitting control line. The gate drive circuit in the drive circuit 61 provides a gate drive signal to the sub-pixels in the display area AA through the gate line, and the light-emitting drive circuit provides a light-emitting drive signal to the sub-pixels in the display area AA through the light-emitting control line, thereby controlling the sub-pixels to emit light. The plurality of leads 71 may include a plurality of drive control signal lines and a plurality of drive test signal lines. The plurality of drive control signal lines include a gate drive control signal line connected to the gate drive circuit and a light-emitting drive control signal line connected to the light-emitting drive circuit. The gate drive control signal line is used to provide the gate drive circuit with a drive control signal required for a gate drive, including but not limited to a first start signal line GSTV, a first clock signal line GCK, and a second clock signal line GCB. The light-emitting drive control signal line is used to provide the light-emitting drive circuit with a light-emitting control signal required for a light-emitting drive, including but not limited to a second start signal line ESTV, a third clock signal line ECK, and a fourth clock signal line ECB. The drive test signal lines include, but are not limited to, a gate output signal wire Gout connected to an output end of the gate drive circuit and a light-emitting output signal wire Eout connected to an output end of the light-emitting drive circuit.

The multiplexing circuit 64 is connected to the plurality of sub-pixels in the display area AA through the plurality of data lines, and is connected to the third set of pins 1603 through the plurality of leads 74. The plurality of leads 74 may include switch control signal lines for controlling the multiplexing circuit to generate a plurality of multiplexing signals, such as, but not limited to, 6 multiplexed switch signal lines connected to the multiplexing circuit for multiplexing each input signal into 6 output signals.

The supply voltage line 68 may be connected to various circuit elements within the display area through a first supply voltage wire, and connected to at least one of the fourth pins 1604 through the lead 78 (a second supply voltage wire). The reference voltage line 69 may be connected to various circuit elements within the display area through a first reference voltage wire, and connected to at least another of the fourth pins 1604 through the lead 79 (a second reference voltage wire). The second supply voltage wire 78 may be, for example, a Y-shaped wire shown in FIG. 4, and two leading-out ends of the Y-shaped wire are connected to two fourth pins 1604, respectively. The second reference voltage wire 79 may be, for example, two strip-shaped wires extending substantially in a straight line as shown in FIG. 4, which are respectively connected to the other two fourth pins 1604. The supply voltage line 68 may include at least one of: a first supply voltage line VDD, a second supply voltage line ELVDD, a third supply voltage line VGH, and an initial voltage line VINT. The reference voltage line 69 may include at least one of: a first reference voltage line VSS, a second reference voltage line ELVSS, and a third reference voltage line VGL.

The plurality of pins 1601, 1602, 1603 and 1604 are respectively connected to the plurality of extension pads 130, for example, in one-to-one correspondence. However, the embodiments of the present disclosure are not limited thereto. In some embodiments, one or more pins may be set to be dummy pins, that is, pins not electrically connected to other circuit structures. In some embodiments, more than one pins may be connected to one extension pad 130, or one pin may be connected to more than one extension pads 130, which is not limited in the present disclosure.

In some embodiments, an initial voltage line 67 may also be provided in the peripheral area PA. The initial voltage line 67 is connected to the sub-pixels in the display area through the initial voltage first wire, and is connected to a fifth pin through an initial voltage second wire 77. In some embodiments, a data drive line 73 may also be provided in the peripheral area PA. The data drive lines 73 may be connected to the multiplexing circuit for providing an input data signal to the multiplexing circuit. Each data drive line 73 may correspond to multiple data lines. The data drive line 73 may be connected to a sixth pin.

Although the cell test circuit, the drive circuit, the multiplexing circuit, the supply voltage line and the reference voltage line, and the signal lines and leads connected to these circuits are shown in specific positions and layouts in the above-mentioned embodiments, this is only for a purpose of illustrating the electrical connection relationships thereof and actual positions and layouts thereof are not limited thereto.

Figure 5:
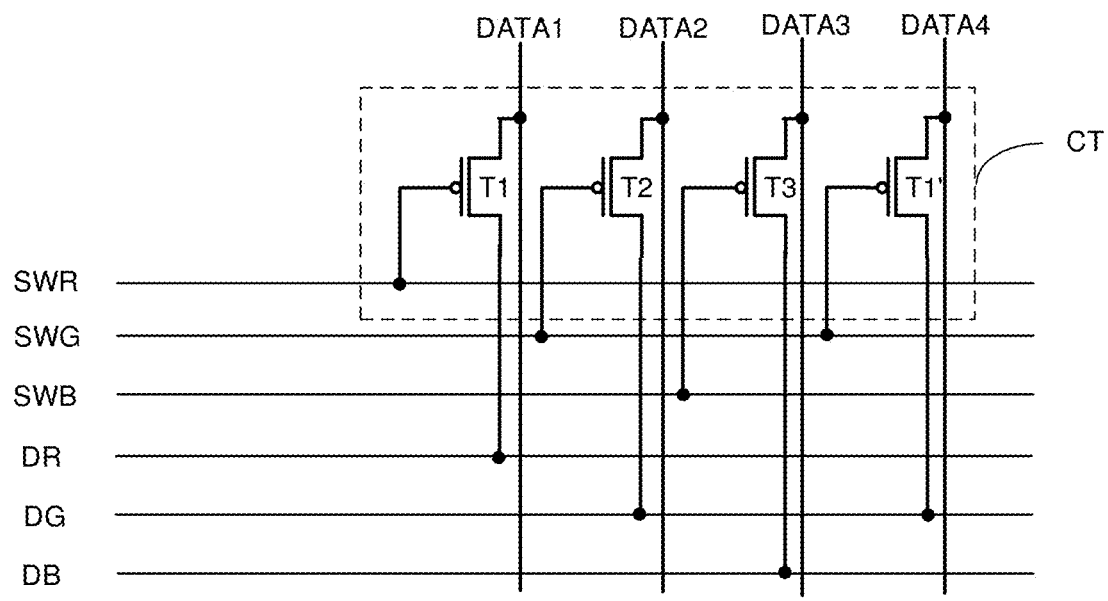
FIG. 5 shows a schematic diagram of a cell test circuit according to an embodiment of the present disclosure.

FIG. 5 shows a schematic diagram of a cell test circuit according to an embodiment of the present disclosure. The cell test circuit may be applied to the display substrate of any of the above-mentioned embodiments.

As shown in FIG. 5, the cell test control signal line connected to the cell test circuit includes a first switch wire SWR, a second switch wire SWG, a third switch wire SWB, a first test data wire DR, a second data wire DG and a third test data wire DB.

A cell test circuit CT may include a plurality of test sub-circuits, and at least one of the plurality of test sub-circuits includes a first transistor, a second transistor and a third transistor. For the sake of simplicity, FIG. 5 shows only 4 transistors in the cell test circuit CT, in which a first test sub-circuit includes transistors T1 (first transistor), T2 (second transistor) and T3 (third transistor) while the transistor T1' belongs to another first test sub-circuit (acting as a first transistor thereof), and so on. A gate electrode of the transistor T1 is electrically connected to the first switch wire SWR, a gate electrode of the transistor T2 is electrically connected to the second switch wire SWG, and a gate electrode of the transistor T3 is electrically connected to the third switch wire SWB. A first pole of the transistor T1 is electrically connected to the first test data wire DR, a first pole of the transistor T2 is electrically connected to the second test data wire DG, and a first pole of the transistor T3 is electrically connected to the third test data wire DB. A second electrode of the transistor T1, a second electrode of the transistor T2 and a second electrode of the transistor T3 are electrically connected to three data lines DATA1, DATA2 and DATA3, respectively.

Although the three switch wires SWR, SWG and SWB are described as an example in the embodiment of FIG. 5, the embodiments of the present disclosure are not limited thereto. In some embodiments, the transistors T1, T2 and T3 may be connected to the same switch wire SW.

The structure of an intersection area of a display substrate according to an embodiment of the present disclosure will be described below with reference to FIG. 6 to FIG. 9B.

Figure 6:
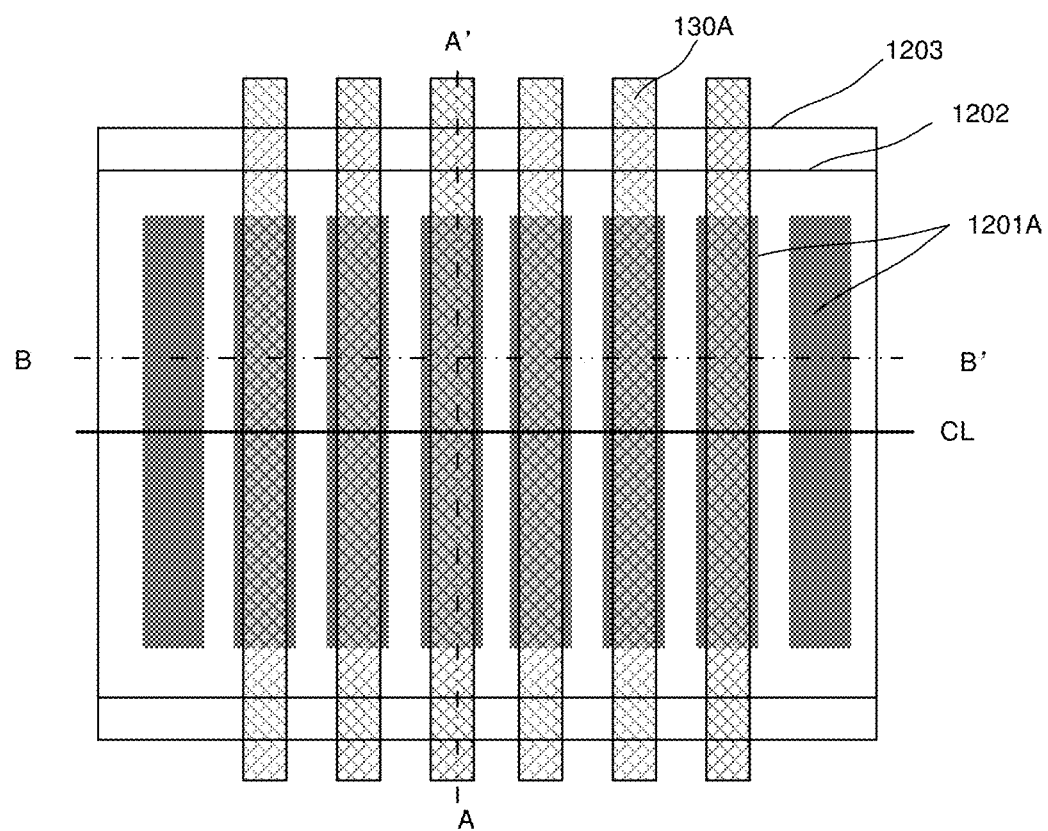
FIG. 6 is a schematic plan view of an intersection area of a display substrate before cutting according to an embodiment of the present disclosure.
Figure 7:
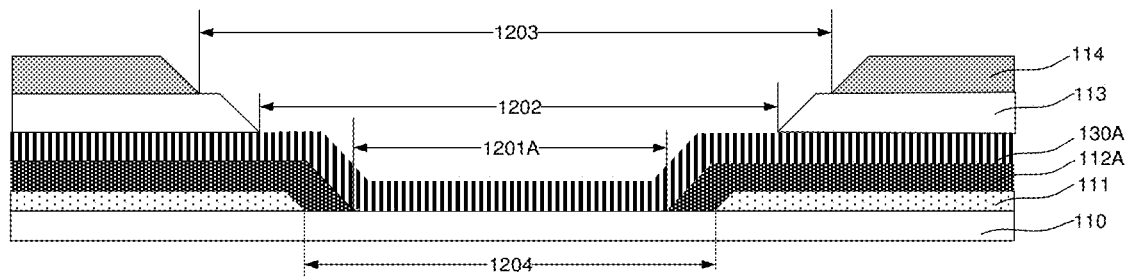
FIG. 7 shows a cross-sectional view taken along AA' of FIG. 6.
Figure 8:
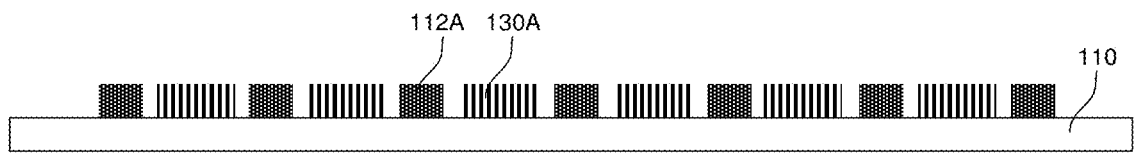
FIG. 8 shows a cross-sectional view taken along BB' of FIG. 6.

FIG. 6 shows a schematic plan view of an intersection area of a display substrate before cutting according to an embodiment of the present disclosure. FIG. 7 shows a cross-sectional view taken along AA' of FIG. 6. FIG. 8 shows a cross-sectional view taken along BB' of FIG. 6. The intersection area before cutting shown in FIG. 6 to FIG. 8 may correspond to, for example, an area X1 shown by a dotted box in FIG. 2.

Referring to FIG. 6 to FIG. 8, the peripheral area of the base substrate 110 includes a first dielectric layer 112A located on the base substrate 110, the first dielectric layer 112A has a plurality of first openings 1201A arranged in a second direction (BB') and extending in a first direction (AA'). At least a portion of the first dielectric layer 112A is removed to form a first opening 1201A. At least portion of the extension pad 130A is located in the first openings 1201A, and a portion of the first dielectric layer 112A between the adjacent first openings 1201A forms a plurality of spacers. As shown in FIG. 6 to FIG. 8, the plurality of spacers formed by the first dielectric layer 112A between the adjacent first openings 1201A are located between the plurality of extension pads 130 and extend in the second direction. Orthographic projections of the plurality of spacers on the base substrate 110 do not overlap an orthographic projection of the plurality of extension pads 130A on the base substrate 110, and the plurality of spacers may electrically insulate the plurality of extension pads 130A from each other. Since the display substrate has not been cut from the substrate to be cut in the embodiments of FIG. 6 to FIG. 8, the plurality of extension pads 130A serve as connection wires for connecting with a contact pad outside the display substrate.

The display substrate may further include a second dielectric layer 113 and a third dielectric layer 114 sequentially stacked on the first dielectric layer 112A. The plurality of extension pads 130A are located between the first dielectric layer 112A and the second dielectric layer 113. At least a portion of each of the second dielectric layer 113 and the third dielectric layer 114 is removed to form a second opening 1202 and a third opening 1203, and a position of the cutting channel may be defined by the second opening and/or the third opening. A projection of the first opening 1201A on the base substrate 110 is located within a projection of the second opening 1202 on the base substrate 110, and the projection of the second opening 1202 on the base substrate 110 is located within a projection of the third opening 1203 on the base substrate 110.

As shown in FIG. 6, an extension direction of the cutting channel may be defined by a cutting line CL, which refers to a center line of the cutting channel in the extension direction, and is a virtual line having the same distance to both sides of the cutting channel. In an intersection area where the cutting channel extends to intersect with the plurality of extension pads 130, the plurality of first openings 1201A are provided in the first dielectric layer 112A, so that the plurality of extension pads 130 are isolated from each other through the plurality of first openings 1201A. The plurality of first openings 1201A separated from each other extend in the first direction (direction indicated by a dash-dotted line AA') and are arranged in the second direction (direction indicated by a dash-dotted line BB'). The first direction is an extension direction of the plurality of extension pads 130A, and the second direction is the extension direction of the cutting channel.

In the intersection area as shown in FIG. 6, each extension pad 130A has a first projection (also denoted by 130A) on the base substrate 110, and each first opening 1201A has a second projection (also denoted by 1201A) on the base substrate 110. Each first projection spans a corresponding second projection in the first direction, and the second projection has a dimension in the second direction greater than or equal to that of the first projection in the second direction. For example, in FIG. 6, for an extension pad 130A and a first opening 1201A with their projections overlapping each other, a dimension (also referred to as a length) of the projection of the extension pad 130A in the AA' direction is greater than that of the first opening 1201A, a dimension (also referred to as a width) of the projection of the extension pad 130A in the BB' direction is less than or equal to that of the first opening 1201A, so that the projection of the extension pad 130A spans the projection of the first opening 1201A in the AA' direction and is completely located within the projection of the first opening 1201A in the BB direction. In FIG. 6, a center line of each first projection 130A in the first direction coincides with a center line of a corresponding second projection 1201A in the first direction, that is, the center lines of the first projection 130A and the second projection 1201A in a length direction coincide. However, the embodiments of the present disclosure are not limited thereto. The center lines of the first projection 130A and the second projection 1201A may have a certain offset from each other. In some examples, a distance between an edge of each first projection 130A and an edge of the corresponding second projection 1201A in the second direction is in a range of 0 μm to 20 μm. Taking a first projection 130A and a second projection 1201A overlapping the first projection 130A in FIG. 6 as an example, a distance between a left edge of the first projection 130A and a left edge of the second projection 1201A and a distance between a right edge of the first projection 130A and a right edge of the second projection 1201A may both be in a range of 0 μm to 20 μm, and the two may be equal or unequal. In this way, the adjacent extension pads 130A may be isolated by a material of the first dielectric layer 112A, so that a short circuit of the extension pads 130A due to a metal residue between the adjacent extension pads 130A during an etching process of the extension pads 130A is avoided.

In FIG. 6, the first direction (AA') is perpendicular to the second direction (BB'), and the second projection 1201A has a rectangle shape. However, the embodiments of the present disclosure are not limited thereto. The technical concept of the present disclosure is applicable to a signal line and a cutting channel that extend to intersect with each other in any other manner, such as a signal line and a cutting channel that intersect each other non-perpendicularly or a signal line and a cutting channel that extend along two arc-shaped or even irregular tracks and intersect with each other, which will be described in further detail below.

In some embodiments, as shown in FIG. 6, at least one of the plurality of first openings 1201A may be set to be dummy, and the dummy first openings do not overlap the extension pads 130A, for example, two first openings on the leftmost and the rightmost in FIG. 6 are dummy first openings.

In some embodiments, as shown in FIG. 7 and FIG. 8, a thickness of the first dielectric layer 112A in a direction perpendicular to a surface of the base substrate 110 may be in a range of 500 nm to 1000 nm, and a thickness of the extension pad 130A in the direction perpendicular to the surface of the base substrate 110 may be in a range of 200 nm to 900 nm.

In some embodiments, as shown in FIG. 7, a fourth dielectric layer 111 between the first dielectric layer 112A and the base substrate 110 may also be provided in the peripheral area of the base substrate 110. A portion of the fourth dielectric layer 111 is removed to form a fourth opening 1204. A projection of the fourth opening 1204 on the base substrate 110 is located within the projection of the second opening 1202 on the base substrate, and the projection of the first opening 1201A on the base substrate 110 is located within the projection of the fourth opening 1204 on the base substrate.

Figure 9A:
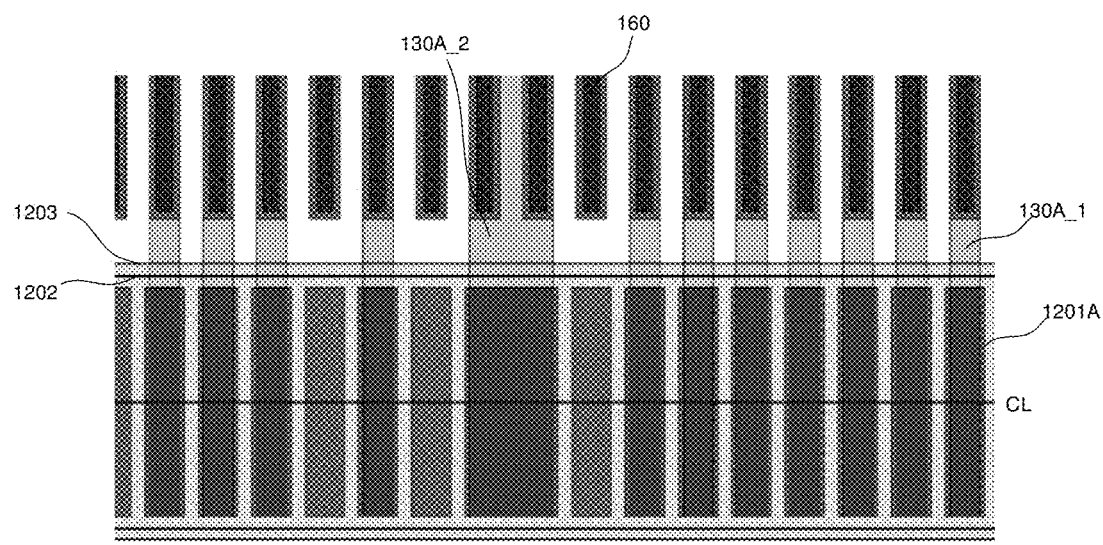
FIG. 9A shows a layout diagram of an intersection area before cutting according to an embodiment of the present disclosure.

FIG. 9A shows a layout diagram of an intersection area before cutting according to an embodiment of the present disclosure. For example, the intersection area may correspond to the area X1 in FIG. 2.

As shown in FIG. 9A, the plurality of extension pads 130A extend perpendicular to the cutting line CL of the cutting channel. The first opening 1201A, the second opening 1202 and the third opening 1203 are located in the cutting channel. The plurality of extension pads 130A may include a plurality of extension pads with different widths, for example, at least one first extension pad 130A_1 with a first width and at least one second extension pad 130A_2 with a second width. The first width is less than the second width. The so-called first width and second width here may refer to dimensions perpendicular to the extension direction of the extension pads, such as dimensions in a horizontal direction in FIG. 9A. In FIG. 9A, each first extension pad 130A_1 is connected to one of the plurality of pins 160, and has a width being approximately equal to a width of a pin. Each second extension pad 130A_2 is connected to at least two of the plurality of pins 160, and has a width being approximately equal to a total width of an area occupied by the pins connected to the second extension pad 130A_2, for example, a width of an area occupied by the two pins. However, the embodiments of the present disclosure are not limited thereto. The plurality of extension pads 130A may further include extension pads with other widths, for example, a third extension pad with a third width. The first width, the second width and the third width are different from each other.

As shown in FIG. 9A, the plurality of extension pads 130A_1 and 130A_2 are respectively connected to the plurality of pins 160 so as to be connected, for example, to any one or more of the above-mentioned wires SW, DR, DG, DB, GSTV, GCK, GCB, ESTV, ECK, ECB, Gout, Eout, MUX1 to MUX6, ELVDD, ELVSS, VINT, VGH, VGL, and then provide corresponding signals to the connected wires. For the sake of simplicity, FIG. 9A only shows several pins among a plurality of pins of a display substrate and extension pads connected to these pins.

Figure 9B:
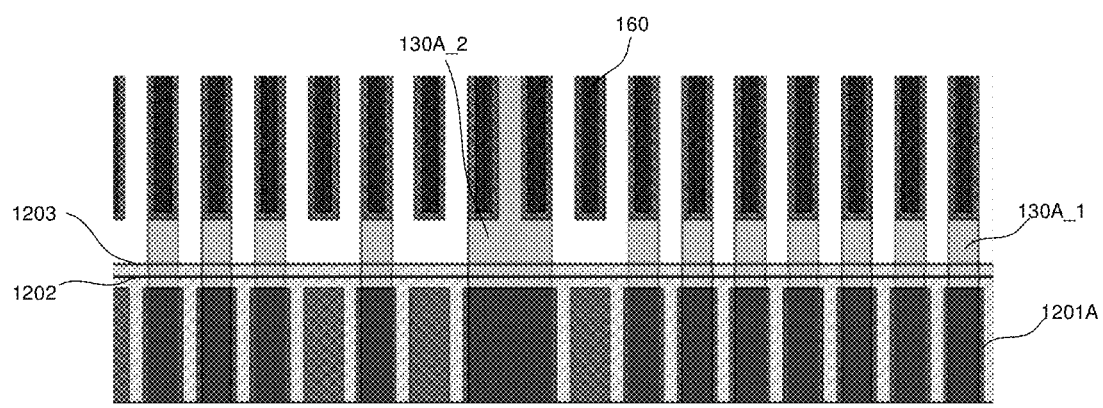
FIG. 9B shows a layout diagram of the intersection area after cutting according to an embodiment of the present disclosure

FIG. 9B shows a layout diagram of an intersection area after cutting according to an embodiment of the present disclosure. For example, the intersection area may correspond to an area X2 in FIG. 4. As shown in FIG. 9B, by cutting the substrate to be cut along the cutting line CL shown in FIG. 9A, the respective extension pads 130A_1 and 130A_2 are cut off to obtain an independent display substrate. As shown in FIG. 9B, in the display substrate obtained after cutting, a length of the extension pads 130A_1 and 130A_2 in the first direction (i.e., the extension direction of the extension pads) is in a range of 0 μm to 100 μm, for example, may be within a range of 70 μm to 90 μm. In some embodiments, the length of the extension pads 130A_1 and 130A_2 in the first direction is 80 μm. The so-called length of the extension pad here may refer to a length extending from the pin 160, that is, a length from an edge of the pin 160 to the cutting channel. As shown in FIG. 9B, in the display substrate obtained after cutting, a length of the first opening 1201A in the first direction is in a range of 0 μm to 90 μm, for example, may be in a range of 40 μm to 60 μm. In some embodiments, the length of the first opening 1201A in the first direction is 50 μm.

The structure of an intersection area of a display substrate according to another embodiment of the present disclosure will be described below with reference to FIG. 10 to FIG. 12.

Figure 10:
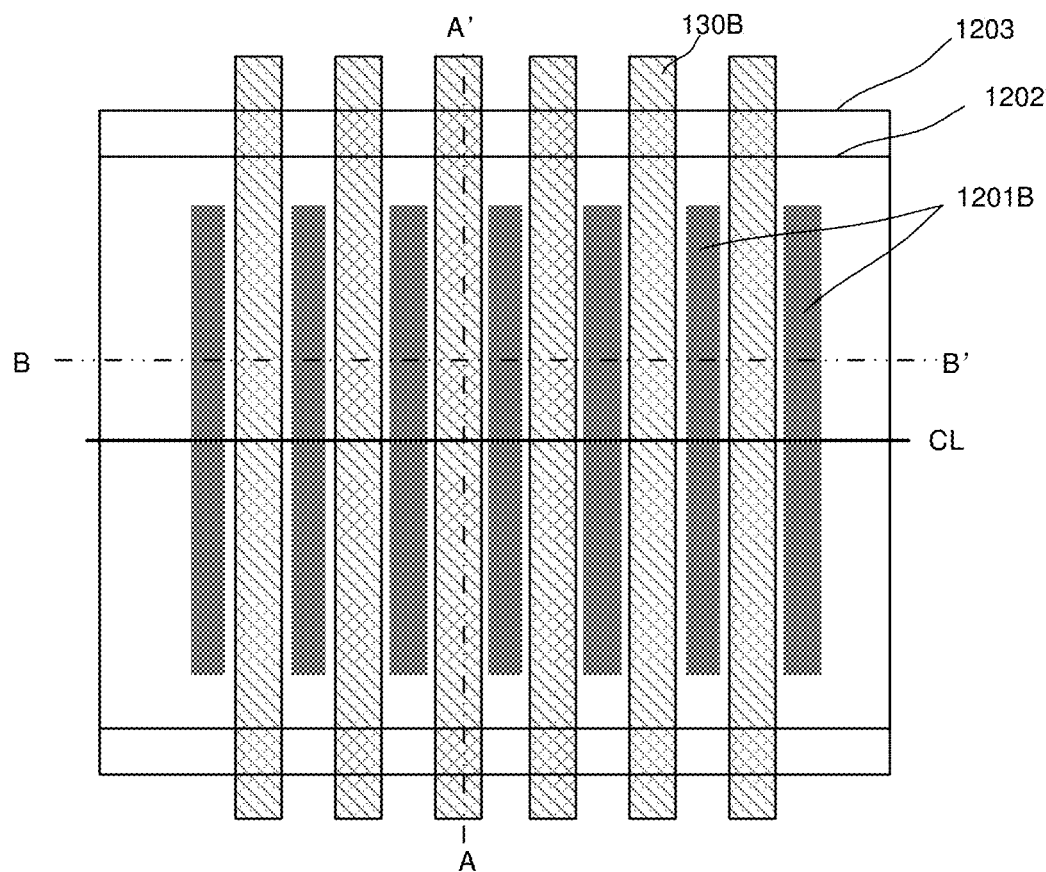
FIG. 10 shows a schematic plan view of an intersection area of a display substrate according to another embodiment of the present disclosure.

FIG. 10 shows a schematic plan view of an intersection area of a display substrate according to another embodiment of the present disclosure. FIG. 11 shows a cross-sectional view taken along AA' of FIG. 10. FIG. 12 shows a cross-sectional view taken along BB' of FIG. 10. In FIG. 10 to FIG. 12, the intersection area may correspond to an intersection area before cutting.

Figure 11:
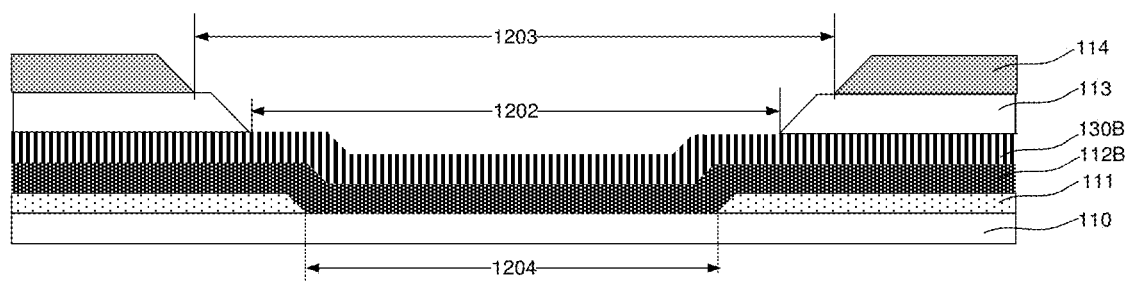
FIG. 11 shows a cross-sectional view taken along AA' of FIG. 10.
Figure 12:
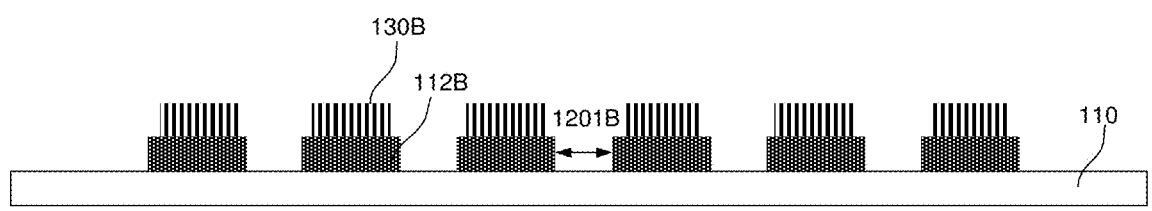
FIG. 12 shows a cross-sectional view taken along BB' of FIG. 10.

As shown in FIG. 10 to FIG. 12, the peripheral area of the base substrate 110 includes a first dielectric layer 112B, a second dielectric layer 113 and a third dielectric layer 114 sequentially stacked on the base substrate 110. The plurality of extension pads 130B are located between the first dielectric layer 112B and the second dielectric layer 113. At least a portion of each of the first dielectric layer 112B, the second dielectric layer 113 and the third dielectric layer 114 is removed to form a first opening 1201B, a second opening 1202 and a third opening 1203, and a position of the cutting channel is defined by the second opening and/or a third opening. A projection of the first opening 1201B on the base substrate 110 is located within a projection of the second opening 1202 on the base substrate 110, and the projection of the second opening 1202 on the base substrate 110 is located within a projection of the third opening 1203 on the base substrate 110.

As shown in FIG. 10, different from FIG. 6 to FIG. 8, a plurality of first openings 1201B serve as a plurality of spacers, the extension pads 130B are located on a side of the first dielectric layer 112B between the adjacent first openings 1201B away from the base substrate 110, and orthographic projections of the plurality of first openings 1201B on the base substrate 110 do not overlap orthographic projections of the plurality of extension pads 130B on the base substrate.

In this way, in the intersection area where the cutting channel extends to intersect with the plurality of extension pads 130B, the plurality of extension pads 130B are isolated from each other through the plurality of first openings 1201B. The plurality of first openings 1201B separated from each other extend in the first direction, which is the extension direction (direction indicated by a dash-dotted line AA') of the plurality of extension pads 130B, and are arranged in the second direction, which is the extension direction (direction indicated by a dash-dotted line BB') of the cutting channel.

As shown in FIG. 10, within the intersection area, each extension pad 130B has a first projection (also denoted by 130B) on the base substrate 110, and each first opening 1201B has a second projection (also denoted by 1201B) on the base substrate 110. Each first projection 130B does not overlap each second projection 1201B, and adjacent first projections 130B are distributed at intervals by at least one second projection 1201B. For example, in FIG. 10, the first projections 130B and the second projections 1201B are alternately arranged, so that there is a second projection 1201B between every two adjacent first projections 130B. In FIG. 6, a center line of each first projection 130B in the first direction is distanced from center lines of two second projections 1201B adjacent to the first projection in the first direction by the same distance. However, the embodiments of the present disclosure are not limited thereto. The distances from each first projection 130B to the two second projections 1201B adjacent to the first projection in the first direction may be set as required. For example, in some embodiments, two edges of the second projection 1201B in the second direction may be made as close as possible to the edges of the first projection 130B adjacent to the second projection 1201B, for example, a distance between the edge of the second projection 1201B in the second direction and the edge of the first projection 130B may be set in a range of 0 μm to 20 μm. In this way, the extension pads 130B may be raised by a material of the first dielectric layer 112B (as shown in FIG. 11), so that a short circuit of the extension pads 130B due to a metal residue between the adjacent extension pads 130B during an etching process of the extension pads 130B is avoided.

In FIG. 10, the first direction (AA') is perpendicular to the second direction (BB'), and the second projection 1201B has a rectangle shape. However, the embodiments of the present disclosure are not limited thereto. The technical concept of the present disclosure is applicable to an extension pad and a cutting channel that extend to intersect with each other in any other manner, such as an extension pad and a cutting channel that intersect with each other non-perpendicularly or a signal line and a cutting channel that extend along two arc-shaped or even irregular trajectories to intersect with each other, which will be explained in further detail below.

In some embodiments, as shown in FIG. 11 and FIG. 12, a thickness of the first dielectric layer 112B in a direction perpendicular to a surface of the base substrate 110 may be in a range of 500 nm to 1000 nm, and a thickness of the extension pad 130B in the direction perpendicular to the surface of the base substrate 110 may be in a range of 200 nm to 900 nm.

In some embodiments, as shown in FIG. 11, a fourth dielectric layer 111 between the first dielectric layer 112B and the base substrate 110 may also be provided in the peripheral area of the base substrate 110. The fourth dielectric layer 111 may use the same design as the fourth dielectric layer in the above-mentioned embodiments, so that a fourth opening 1204 is provided in each cutting channel in addition to the first opening 1201B, the second opening 1202 and the third opening 1203.

Figure 13:
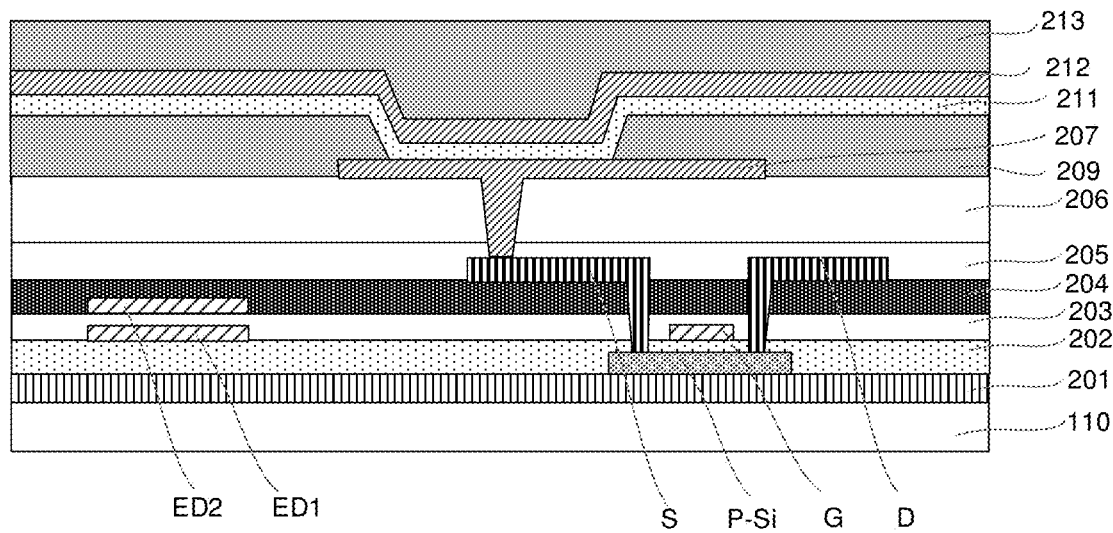
FIG. 13 shows a structural diagram of a sub-pixel of a display area according to an embodiment of the present disclosure.

FIG. 13 shows a structural diagram of a sub-pixel of a display area according to an embodiment of the present disclosure.

As shown in FIG. 13, at least one of the plurality of sub-pixels in the display substrate includes a drive thin film transistor and a storage capacitor. The drive thin film transistor includes an active layer P—Si located on the base substrate 110, a gate electrode G located on a side of the active layer P—Si away from the base substrate 110, a first gate insulating layer 202 located between the active layer P—Si and the gate electrode G, a second gate insulating layer 203 located on a side of the gate electrode G away from the base substrate 110, an interlayer dielectric layer 204 located on a side of the second gate insulating layer 203 away from the base substrate, and a source electrode S and a drain electrode D located on a side of the interlayer dielectric layer 204 away from the base substrate. The storage capacitor includes a first capacitor electrode ED1 and a second capacitor electrode ED2. The first capacitor electrode ED1 is located in the same layer as the gate electrode G. The second capacitor electrode ED2 is located between the second gate insulating layer 203 and the interlayer dielectric layer 204. The plurality of signal lines in the above-mentioned embodiments are disposed in the same layer as at least one of the source electrode S and the drain electrode D of the plurality of sub-pixels. The first dielectric layer in the above-mentioned embodiments is disposed in the same layer as the interlayer dielectric layer 204.

As shown in FIG. 13, at least one of the plurality of sub-pixels further includes a planarization layer 206, an anode 207 and a pixel defining layer 209. The planarization layer 206 is located on the side of the interlayer dielectric layer 204 away from the base substrate 110. The anode 207 is located on a side of the planarization layer 206 away from the base substrate 110 and is connected to the source electrode S or the drain electrode D by passing through the planarization layer 206. The pixel defining layer 209 is located on the side of the planarization layer 206 away from the base substrate 110 and partially covers the anode 207. The second dielectric layer in the above-mentioned embodiments may be disposed in the same layer as the planarization layer 206, and the third dielectric layer may be disposed in the same layer as the pixel defining layer 209.

In some embodiments, the sub-pixels may further include a buffer layer 201. The buffer layer 201 is located between the base substrate 110 and the first gate insulating layer 202, and the active layer P—Si of the drive thin film transistor is located between the buffer layer 201 and the first gate insulating layer 202. The fourth dielectric layer in the above-mentioned embodiments may be disposed in the same layer as at least one of the buffer layer 201, the first gate insulating layer 202 and the second gate insulating layer 203. For example, the fourth dielectric layer may include a first sub-layer, a second sub-layer and a third sub-layer sequentially stacked on the base substrate. The first sub-layer is disposed in the same layer as the buffer layer 201. The second sub-layer is disposed in the same layer as the first gate insulating layer 202. The third sub-layer is disposed in the same layer as the second gate insulating layer 203.

In some embodiments, the sub-pixels may further include a passivation layer 205. The passivation layer 205 is located between the planarization layer 206 and the interlayer dielectric layer 204 and covers the source electrode S and the drain electrode D of the drive thin film transistor. The anode 207 is connected to the source electrode S of the drive thin film transistor by passing through the interlayer dielectric layer 206 and the passivation layer 205.

In some embodiments, the sub-pixels may further include a light-emitting layer 211 and a cathode 212. The light-emitting layer 211 is located on a side of the anode 210 away from the base substrate 110 and partially covers the anode 207. The cathode 212 is located on a side of the light-emitting layer 211 away from the base substrate 110.

In some embodiments, the sub-pixels may further include an encapsulation layer 213. The encapsulation layer 213 is located on a side of the cathode 212 away from the base substrate 110. In some embodiments, the encapsulation layer 213 may include a first inorganic encapsulation layer, an organic encapsulation layer and a second inorganic encapsulation layer which are sequentially stacked.

Figure 14:
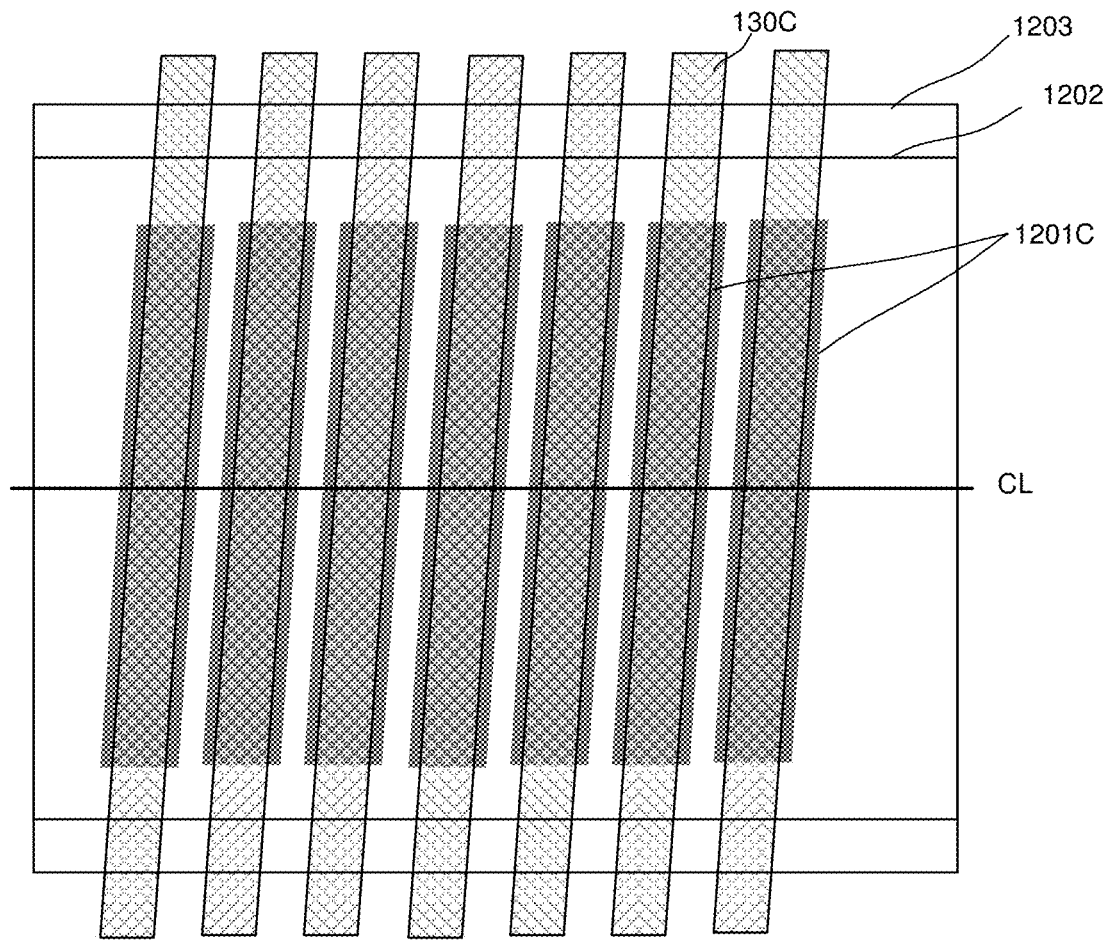
FIG. 14 shows a schematic plan view of an intersection area of a display substrate according to another embodiment of the present disclosure.

FIG. 14 shows a schematic plan view of an intersection area according to another embodiment of the present disclosure. The intersected structure of the display substrate in FIG. 14 is similar to the structure shown in FIG. 6 to FIG. 8, with a difference at least in that the second direction (i.e., a direction of the cutting line CL) in FIG. 14 is not perpendicular to the first direction (i.e., an extension direction of an extension pad 130C). As shown in FIG. 14, similar to FIG. 6 to FIG. 8, a first opening 1201C, a second opening 1202 and a third opening 1203 are respectively formed in the first dielectric layer, the second dielectric layer and the third dielectric layer, and a plurality of extension pads 130C extend to intersect with the cutting channel. A plurality of first openings 1201C extend in the first direction, and are arranged in the direction (the second direction) of the cutting line CL. The first direction and the second direction intersect with each other and are not perpendicular to each other. A projection of each extension pad 130C on the base substrate overlaps a projection of a corresponding first opening 1201C on the base substrate, in a manner similar to that shown in FIG. 6 to FIG. 8, which will not be repeated here. As shown in FIG. 14, a projection of the first opening 1201C on the base substrate has a parallelogram shape. Two of the four sides of the parallelogram extend parallel to the first direction, and the other two of the four sides extend parallel to the second direction.

Figure 15:
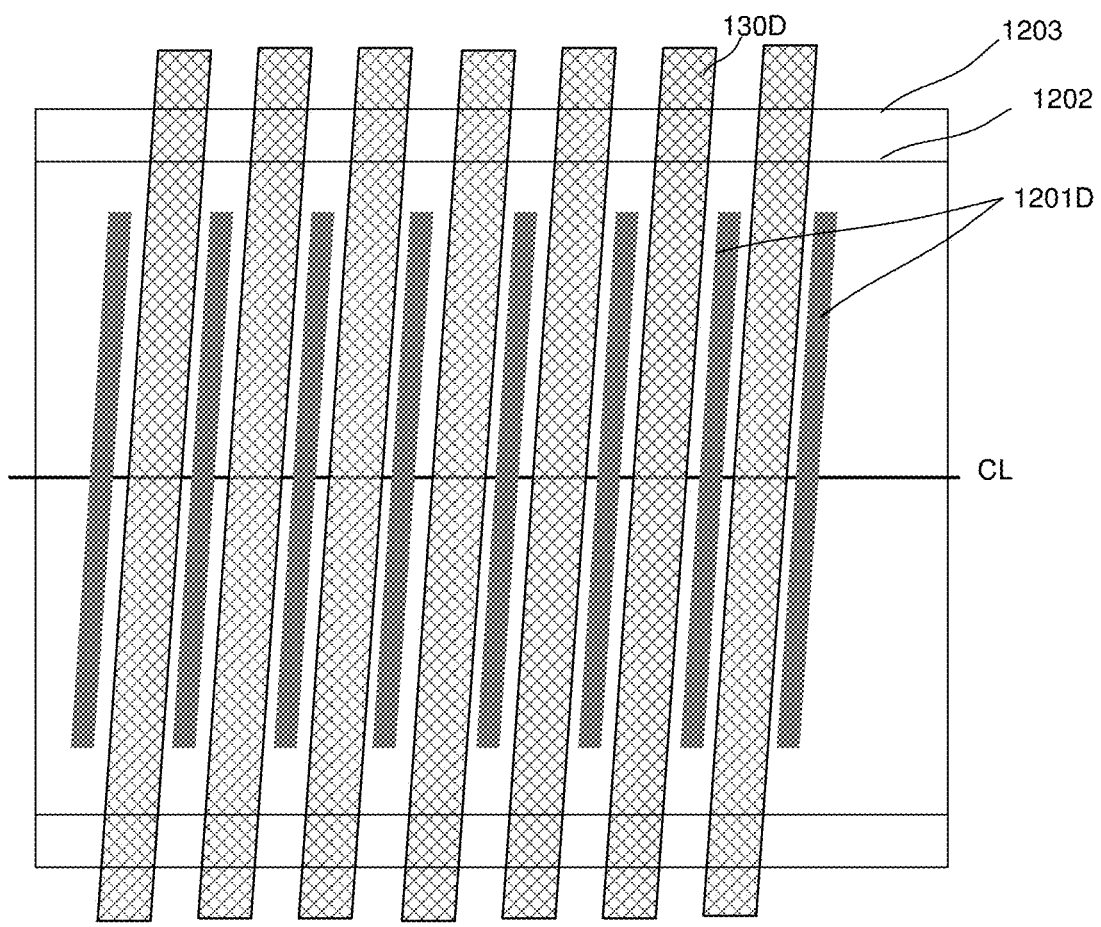
FIG. 15 shows a schematic plan view of an intersection area of a display substrate according to another embodiment of the present disclosure.

FIG. 15 shows a schematic plan view of an intersection area of a display substrate according to another embodiment of the present disclosure. The structure of the intersection area of the display substrate in FIG. 15 is similar to the structure shown in FIG. 10 to FIG. 12, with a difference at least in that an extension direction (i.e., the direction of the cutting line CL) of the cutting channel 120 in FIG. 15 is not perpendicular to an extension direction of an extension pad 130D. As shown in FIG. 15, similar to FIG. 10 to FIG. 12, a first opening 1201D, a second opening 1202 and a third opening 1203 are respectively formed in the first dielectric layer, the second dielectric layer and the third dielectric layer, and a plurality of extension pads 130D extend to intersect with the cutting channel 120. A plurality of first openings 1201D extend in an extension direction (the first direction) of the extension pad 130D, and are arranged in the direction (the second direction) of the cutting line CL. The first direction and the second direction intersect with each other and are not perpendicular to each other. A projection of each extension pad 130D on the base substrate overlaps a projection of a corresponding first opening 1201D on the base substrate, in a manner similar to that shown in FIG. 10 to FIG. 12, which will not be repeated here. As shown in FIG. 15, a projection of the first opening 1201D on the base substrate has a parallelogram shape. Two of the four sides of the parallelogram extend parallel to the first direction, and the other two of the four sides extend parallel to the second direction.

The structure of an intersection area of a display substrate according to another embodiment of the present disclosure will be described below with reference to FIG. 16 to FIG. 18.

Figure 16:
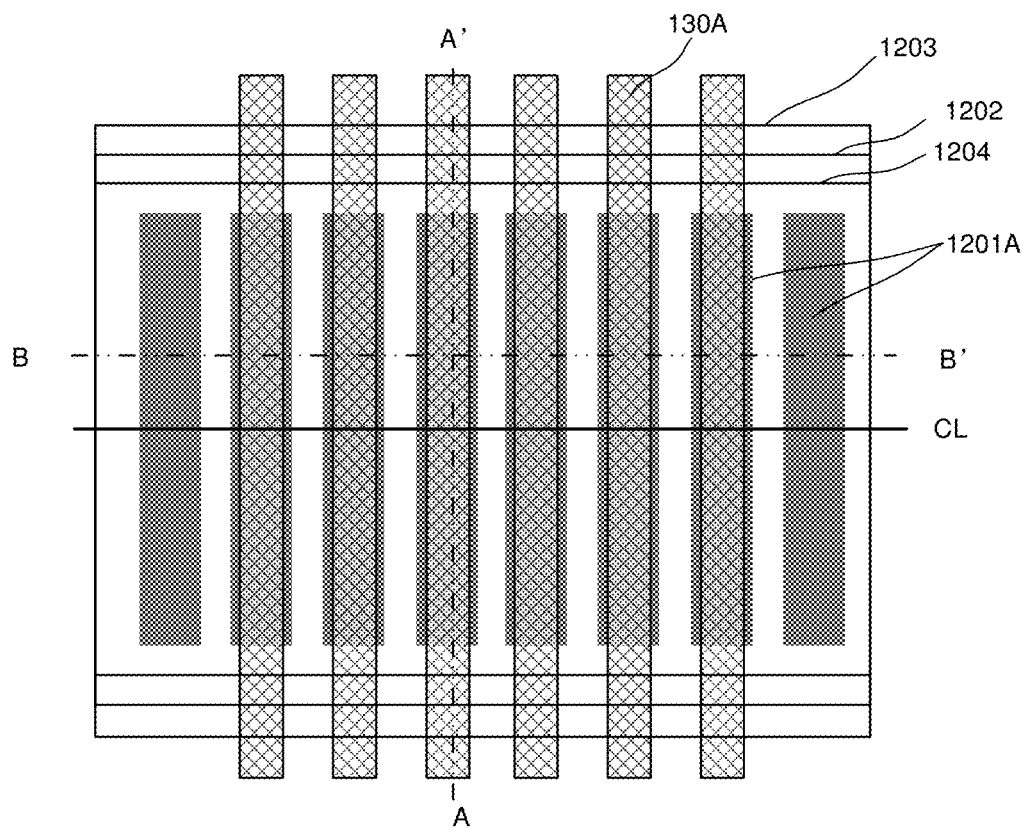
FIG. 16 shows a schematic plan view of an intersection area of a display substrate according to another embodiment of the present disclosure.

FIG. 16 shows a schematic plan view of an intersection area according to another embodiment of the present disclosure. FIG. 17 shows a cross-sectional view taken along AA' of FIG. 16. FIG. 18 shows a cross-sectional view taken along BB' of FIG. 16.

Figure 17:
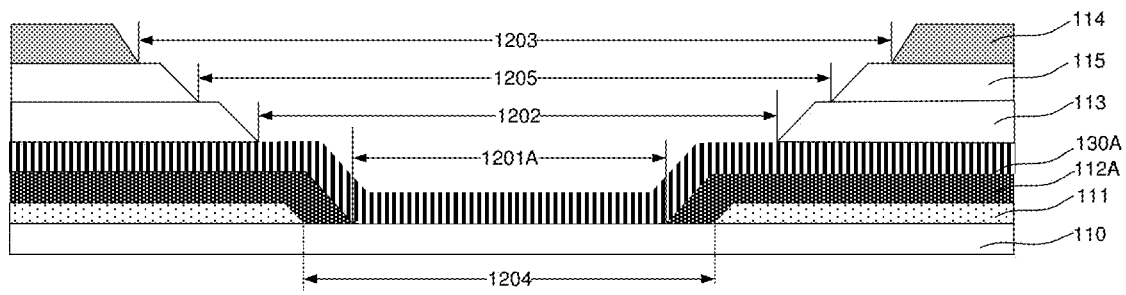
FIG. 17 shows a cross-sectional view taken along AA' of FIG. 16.
Figure 18:
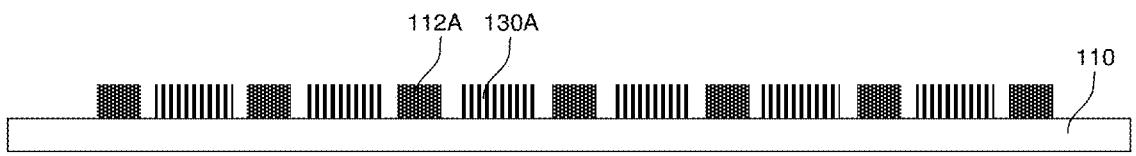
FIG. 18 shows a cross-sectional view taken along BB' of FIG. 16.

The structure of the intersection area of the display substrate in FIG. 16 to FIG. 18 is similar to the structure shown in FIG. 6 to FIG. 8, with a difference at least in that the peripheral area of the base substrate in FIG. 16 to FIG. 18 further includes a fifth dielectric layer 115. For the sake of simplicity, the difference will be mainly described in detail below.

As shown in FIG. 16 to FIG. 18, the peripheral area of the display substrate includes a fourth dielectric layer 111, a first dielectric layer 112A, a plurality of extension pads 130A, a second dielectric layer 113, a fifth dielectric layer 115 and a third dielectric layer 114. The layout of the extension pads 130A and the first to fourth dielectric layers may be the same as that described with reference to FIG. 6 to FIG. 8. The fifth dielectric layer 115 is located between the second dielectric layer 113 and the third dielectric layer 114. A portion of the fifth dielectric layer 115 is removed to form a fifth opening 1205. A projection of the fifth opening 1205 on the base substrate 110 is located within a projection of the third opening 114 on the base substrate 110, and a projection of the second opening 113 on the base substrate 110 is located within the projection of the fifth opening 1205 on the base substrate 110.

Figure 19:
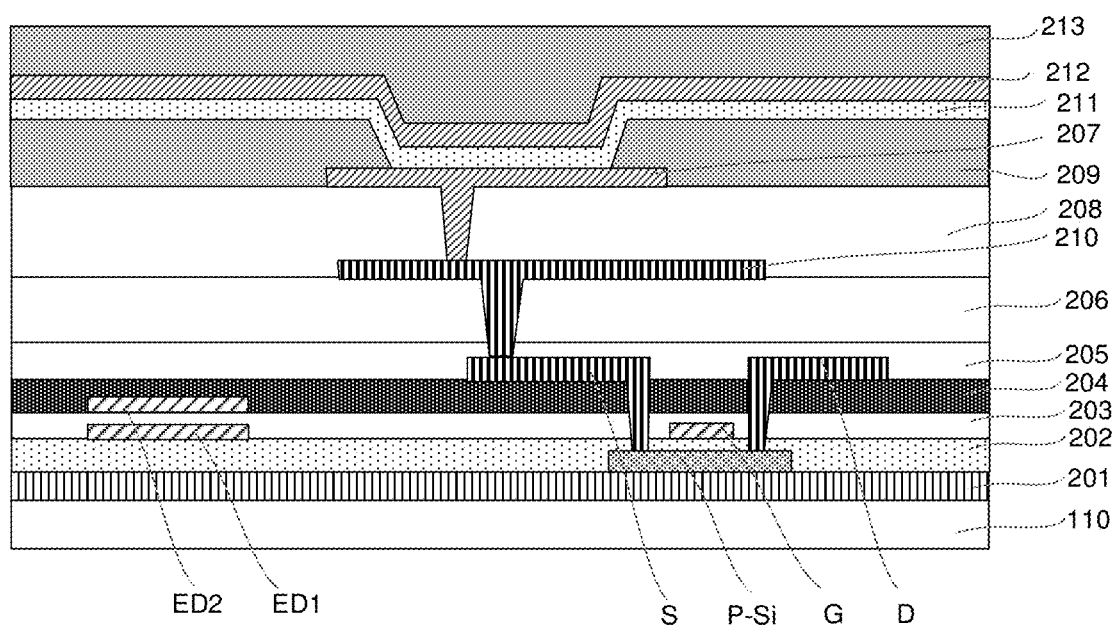
FIG. 19 shows a structural diagram of a sub-pixel of a display area according to another embodiment of the present disclosure.

FIG. 19 shows a structural diagram of a sub-pixel of a display area according to another embodiment of the present disclosure. The sub-pixel structure of FIG. 19 is similar to that of FIG. 13, with a difference at least in that the interlayer dielectric layer of the sub-pixel of FIG. 19 includes a first planarization layer 206 and a second planarization layer 208, and the sub-pixel further includes a transfer electrode 210.

As shown in FIG. 19, at least one of the plurality of subpixels includes a drive thin film transistor and a storage capacitor. The drive thin film transistor includes an active layer P—Si located on the base substrate 110, a gate electrode G located on a side of the active layer P—Si away from the base substrate 110, a first gate insulating layer 202 located between the active layer P—Si and the gate electrode G, a second gate insulating layer 203 located on a side of the gate electrode G away from the base substrate 110, an interlayer dielectric layer 204 located on a side of the second gate insulating layer 203 away from the base substrate, and a source electrode S and a drain electrode D located on a side of the interlayer dielectric layer 204 away from the base substrate. The storage capacitor includes a first capacitor electrode ED1 and a second capacitor electrode ED2. The first capacitor electrode ED1 is located in the same layer as the gate electrode G. The second capacitor electrode ED2 is located between the second gate insulating layer 203 and the interlayer dielectric layer 204. The plurality of signal lines in the embodiments of FIG. 16 to FIG. 18 are disposed in the same layer as at least one of the source electrodes S and the drain electrodes D of the plurality of sub-pixels. The first dielectric layer in the above-mentioned embodiments is disposed in the same layer as the interlayer dielectric layer 204.

As shown in FIG. 19, at least one of the plurality of sub-pixels further includes a first planarization layer 206, a second planarization layer 208, a transfer electrode 210, an anode 207 and a pixel defining layer 209. The first planarization layer 206 is located on a side of the interlayer dielectric layer 204 away from the base substrate 110. The transfer electrode 210 is located on a side of the first planarization layer 206 away from the base substrate 110, and is connected to the source electrode S of the thin film transistor through a via hole in the first planarization layer 206. The second planarization layer 208 is located on a side of the transfer electrode 210 away from the base substrate 110. The anode 207 is located on a side of the second planarization layer 208 away from the base substrate 110 and is connected to the transfer electrode 210 through a via hole in the second planarization layer 208. The pixel defining layer 209 is located on the side of the second planarization layer 208 away from the base substrate and at least partially covers the anode 207. The second dielectric layer in the above described embodiments of FIG. 16 to FIG. 18 may be disposed in the same layer as the first planarization layer 206, the third dielectric layer may be disposed in the same layer as the pixel defining layer 209, and the fifth dielectric layer may be disposed in the same layer as the second planarization layer 208.

In some embodiments, the sub-pixel may further include a buffer layer 201. The buffer layer 201 is located between the base substrate 110 and the first gate insulating layer 202. The active layer P—Si of the drive thin film transistor is located between the buffer layer 201 and the first gate insulating layer 202. The fourth dielectric layer in the above-mentioned embodiments may include a first sub-layer, a second sub-layer and a third sub-layer sequentially stacked on the base substrate. The first sub-layer is disposed in the same layer as the buffer layer 201, the second sub-layer is disposed in the same layer as the first gate insulating layer 202, and the third sub-layer is disposed in the same layer as the second gate insulating layer 203.

In some embodiments, the sub-pixels may further include a passivation layer 205. The passivation layer 205 is located between the planarization layer 206 and the interlayer dielectric layer 204 and covers the source electrode S and the drain electrode D of the drive thin film transistor. The anode 207 is connected to the source electrode S of the drive thin film transistor by passing through the interlayer dielectric layer 206 and the passivation layer 205.

In some embodiments, the sub-pixels may further include a light-emitting layer 211 and a cathode 212. The light-emitting layer 211 is located on a side of the anode 210 away from the base substrate 110 and partially covers the anode 210. The cathode 212 is located on a side of the light-emitting layer 211 away from the base substrate 110.

In some embodiments, the sub-pixels may further include an encapsulation layer 213. The encapsulation layer 213 is located on a side of the cathode 212 away from the base substrate 110. In some embodiments, the encapsulation layer 213 may include a first inorganic encapsulation layer, an organic encapsulation layer, and a second inorganic encapsulation layer which are sequentially stacked.

It should be noted that, in the above-mentioned description, the technical solutions of the embodiments of the present disclosure are shown only by way of example, which does not mean that the embodiments of the present disclosure are limited to the above-mentioned steps and structures. Where possible, steps and structures may be adjusted and selected as required. Therefore, some steps and units are not necessary elements for implementing the general inventive concept of the embodiments of the present disclosure.

So far, the present disclosure has been described in conjunction with the preferred embodiments. It should be understood that those skilled in the art may make various other changes, substitutions and additions without departing from the spirit and scope of the embodiments of the present disclosure. Accordingly, the scope of embodiments of the present disclosure should not be limited to the above-mentioned specific embodiments, but should be defined by the appended claims.

The invention claimed is:

1. A display substrate, comprising:
 a base substrate comprising a display area and a peripheral area located on at least one side of the display area;
 a plurality of sub-pixels located in the display area;
 a plurality of pins located in the peripheral area of the base substrate and configured to transmit an electrical signal to the plurality of sub-pixels, wherein orthographic projections of the plurality of pins on the base substrate extend in a first direction and are distributed at intervals in a second direction intersecting with the first direction;
 a plurality of leads located in at least the peripheral area of the base substrate, wherein the plurality of pins are electrically connected to the plurality of sub-pixels through the plurality of leads;
 a plurality of extension pads located on a side of the plurality of pins away from the display area, wherein the plurality of extension pads extend in the first direction and are distributed at intervals in the second direction, and the plurality of extension pads are electrically connected to the plurality of pins; and
 a plurality of spacers located between the plurality of extension pads and extending in the first direction, wherein orthographic projections of the plurality of spacers on the base substrate do not overlap orthographic projections of the plurality of extension pads on the base substrate, and the plurality of spacers are configured to electrically insulate the plurality of extension pads from each other,
 wherein the display substrate comprises a first dielectric layer located on the base substrate, the first dielectric layer has a plurality of first openings arranged in the second direction and extending in the first direction, at least a portion of the extension pad is located in the first opening, and a portion of the first dielectric layer between adjacent first openings is implemented as the plurality of spacers;
 wherein the display substrate further comprises a second dielectric layer and a third dielectric layer located in the peripheral area, wherein the second dielectric layer is located on a side of the first dielectric layer away from the base substrate, the third dielectric layer is located on a side of the second dielectric layer away from the base substrate, the extension pad is located in a conductor layer between the first dielectric layer and the second dielectric layer, the second dielectric layer has a second opening, the third dielectric layer has a third opening, and at least a portion of the extension pad is exposed from the second opening and the third opening;
 wherein orthographic projections of the plurality of first openings on the base substrate all fall within an orthographic projection of the second opening on the base substrate.

2. The display substrate according to claim 1, wherein the plurality of spacers and the plurality of extension pads are alternately distributed.

3. The display substrate according to claim 2, wherein the plurality of spacers and the plurality of extension pads are alternately distributed one by one.

4. The display substrate according to claim 1, wherein the orthographic projections of the plurality of first openings on the base substrate are located within an orthographic projection of the second opening on the base substrate, and the orthographic projection of the second opening on the base substrate is located within an orthographic projection of the third opening on the base substrate.

5. The display substrate of claim 1, wherein each of the plurality of extension pads has a first orthographic projection on the base substrate, each of the plurality of spacers has a second orthographic projection on the base substrate, and a distance between each first orthographic projection and a second orthographic projection adjacent to the first orthographic projection in the second direction is in a range of 0 μm to 20 μm.

6. The display substrate according to claim 5, wherein a center line of each first orthographic projection in the first direction is distanced from center lines of two second orthographic projections adjacent to the first orthographic projection in the first direction by the same distance.

7. The display substrate according to claim 1, wherein the first direction is perpendicular to the second direction, and the orthographic projection of the spacer on the base substrate has a rectangle shape;
 or wherein the first direction is not perpendicular to the second direction, and the orthographic projection of the spacer on the base substrate has a parallelogram shape.

8. The display substrate according to claim 1, wherein a thickness of the first dielectric layer is in a range of 500 nm to 1000 nm, and a thickness of the extension pad in a direction perpendicular to a surface of the base substrate is in a range of 200 nm to 900 nm;
 wherein a dimension of the spacer in the first direction is less than a dimension of the extension pad in the first direction.

9. The display substrate according to claim 1, further comprising:
 a test-related circuit located in the peripheral area and arranged on a side of the plurality of pins facing the display area, wherein the test-related circuit surrounds at least a portion of the display area, and the test-related circuit is connected to the plurality of sub-pixels in the display area through a plurality of signal lines and is connected to the plurality of pins through the plurality of leads.

10. The display substrate of claim 9, wherein the plurality of extension pads comprise at least one first extension pad and at least one second extension pad, each first extension pad is connected to one of the plurality of pins, each second extension pad is connected to at least two of the plurality of pins, and a line width of the first extension pad is less than a line width of the second extension pad.

11. The display substrate of claim 9, wherein the test-related circuit comprises a cell test circuit, the plurality of signal lines comprises a plurality of data lines, the plurality of leads comprise a plurality of cell test control signal lines, and the plurality of pins comprises a plurality of first pins, and wherein the cell test circuit is connected to the plurality of sub-pixels in the display area through the plurality of data lines, and is connected to the plurality of first pins through the cell test control signal lines.

12. The display substrate according to claim 11, wherein the test-related circuit further comprises a drive circuit, the plurality of signal lines further comprises a plurality of drive signal lines, the plurality of leads further comprises a plurality of drive control signal lines and a plurality of drive test signal lines, and the plurality of pins further comprise a plurality of second pins, and wherein the drive circuit is connected to the plurality of sub-pixels in the display area through the plurality of drive signal lines, and is connected to the plurality of second pins through the plurality of drive control signal lines and the plurality of drive test signal lines; wherein the test-related circuit further comprises a multiplexing circuit, the plurality of leads further comprises a plurality of multiplexing control signal lines, and the plurality of pins further comprises a plurality of third pins, and wherein the multiplexing circuit is connected to the plurality of sub-pixels in the display area through the plurality of data lines, and is connected to the plurality of third pins through the plurality of multiplexing control signal lines;
wherein the test-related circuit further comprises a supply voltage line and a reference voltage line, the plurality of signal lines further comprises a first supply voltage wire and a first reference voltage wire, the plurality of leads further comprises a second supply voltage wire and a second reference voltage wire, and the plurality of pins further comprises a plurality of fourth pins, and wherein the supply voltage line is connected to the plurality of sub-pixels in the display area through the first supply voltage wire, and the reference voltage line is connected to the plurality of sub-pixels in the display area through the first reference voltage wire, the supply voltage line is connected to at least one of the plurality of fourth pins through the second supply voltage wire, and the reference voltage line is connected to at least another of the plurality of fourth pins through the second reference voltage wire.

13. The display substrate according to claim 1, further comprising:
a fourth dielectric layer located in the peripheral area and arranged between the first dielectric layer and the base substrate, wherein the fourth dielectric layer has a fourth opening, an orthographic projection of the fourth opening on the base substrate is located within the orthographic projection of the second opening on the base substrate, and the orthographic projections of the plurality of first openings on the base substrate are located within the orthographic projection of the fourth opening on the base substrate; and
a fifth dielectric layer located in the peripheral area and arranged between the second dielectric layer and the third dielectric layer, wherein the fifth dielectric layer has a fifth opening, an orthographic projection of the fifth opening on the base substrate is located within the orthographic projection of the third opening on the base substrate, and the orthographic projection of the second opening on the base substrate is located within the orthographic projection of the fifth opening on the base substrate.

14. The display substrate according to claim 1, wherein at least one of the plurality of sub-pixels comprises a drive thin film transistor and a storage capacitor;
the drive thin film transistor comprises an active layer located on the base substrate, a gate electrode located on a side of the active layer away from the base substrate, a first gate insulating layer located between the active layer and the gate electrode, a second gate insulating layer located on a side of the gate electrode away from the base substrate, an interlayer dielectric layer located on a side of the second gate insulating layer away from the base substrate, and a source electrode and a drain electrode located on a side of the interlayer dielectric layer away from the base substrate;
the storage capacitor comprises a first capacitor electrode and a second capacitor electrode, the first capacitor electrode is located in the same layer as the gate electrode, and the second capacitor electrode is located between the second gate insulating layer and the interlayer dielectric layer; and
the plurality of extension pads are disposed in the same layer as at least one of the source electrode and the drain electrode of the plurality of sub-pixels, and the first dielectric layer located in the peripheral area is disposed in the same layer as the interlayer dielectric layer.

15. The display substrate according to claim 14, wherein at least one of the plurality of sub-pixels further comprises:
a first planarization layer located on the side of the interlayer dielectric layer away from the base substrate;
an anode located on a side of the first planarization layer away from the base substrate and connected to the source electrode or the drain electrode by passing through the first planarization layer;
a pixel defining layer located on the side of the first planarization layer away from the base substrate and partially covering the anode,
wherein the second dielectric layer located in the peripheral area is disposed in the same layer as the first planarization layer, and the third dielectric layer located in the peripheral area is disposed in the same layer as the pixel defining layer, or
wherein at least one of the plurality of sub-pixels further comprises:
a second planarization layer located on the side of the interlayer dielectric layer away from the base substrate;
a transfer electrode located on a side of the second planarization layer away from the base substrate, and connected to the source electrode of the thin film transistor through a via hole disposed in the second planarization layer;
a third planarization layer located on a side of the transfer electrode away from the base substrate;
an anode located on a side of the third planarization layer away from the base substrate, and connected to the transfer electrode through a via hole in the third planarization layer; and
a pixel defining layer located on the side of the third planarization layer away from the base substrate and at least partially covering the anode,
wherein the peripheral area of the base substrate further comprises a fifth dielectric layer located between the second dielectric layer and the third dielectric layer, the second dielectric layer is disposed in the same layer as the second planarization layer, the third dielectric layer is disposed in the same layer as the pixel defining layer, and the fifth dielectric layer is disposed in the same layer as the third planarization layer.

16. The display substrate according to claim 14, wherein at least one of the plurality of sub-pixels further comprises a buffer layer located between the base substrate and the first gate insulating layers; and the peripheral area of the base substrate further comprises a fourth dielectric layer located between the first dielectric layer and the base substrate, and the fourth dielectric layer is disposed in the same layer as at least one of the buffer layer, the first gate insulating layer and the second gate insulating layers are disposed on the same layer.

17. A display device comprising the display substrate of claim 1.

18. A display substrate, comprising:
a base substrate comprising a display area and a peripheral area located on at least one side of the display area;
a plurality of sub-pixels located in the display area;
a plurality of pins located in the peripheral area of the base substrate and configured to transmit an electrical signal to the plurality of sub-pixels, wherein orthographic projections of the plurality of pins on the base substrate extend in a first direction and are distributed at intervals in a second direction intersecting with the first direction;
a plurality of leads located in at least the peripheral area of the base substrate, wherein the plurality of pins are electrically connected to the plurality of sub-pixels through the plurality of leads;
a plurality of extension pads located on a side of the plurality of pins away from the display area, wherein the plurality of extension pads extend in the first direction and are distributed at intervals in the second direction, and the plurality of extension pads are electrically connected to the plurality of pins; and
a plurality of spacers located between the plurality of extension pads and extending in the first direction, wherein orthographic projections of the plurality of spacers on the base substrate do not overlap orthographic projections of the plurality of extension pads on the base substrate, and the plurality of spacers are configured to electrically insulate the plurality of extension pads from each other,
wherein the display substrate comprises a first dielectric layer located on the base substrate, the first dielectric layer has a plurality of first openings arranged in the second direction and extending in the first direction, the plurality of first openings are implemented as the plurality of spacers, the extension pads are located on a side of the first dielectric layer away from the base substrate and are between adjacent first openings, and orthographic projections of the plurality of first openings on the base substrate do not overlap the orthographic projections of the plurality of extension pads on the base substrate.

* * * * *